United States Patent
Hayashi et al.

(10) Patent No.: US 7,667,284 B2
(45) Date of Patent: Feb. 23, 2010

(54) METHOD OF MANUFACTURING ORGANIC ELECTROLUMINESCENT DEVICE AND ORGANIC ELECTROLUMINESCENT DEVICE

(75) Inventors: Kenji Hayashi, Suwa (JP); Ryoichi Nozawa, Tatsuno-machi (JP); Yukio Yamauchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/285,828

(22) Filed: Oct. 15, 2008

(65) Prior Publication Data
US 2009/0050883 A1 Feb. 26, 2009

Related U.S. Application Data

(62) Division of application No. 11/243,411, filed on Oct. 5, 2005, now Pat. No. 7,452,738.

(30) Foreign Application Priority Data

Oct. 22, 2004 (JP) .................. 2004-307756
Jul. 20, 2005 (JP) .................. 2005-209534

(51) Int. Cl.
   H01L 29/24 (2006.01)
   H01L 31/0203 (2006.01)
(52) U.S. Cl. .............. 257/433; 257/40; 257/88; 257/787; 257/E25.032; 257/100
(58) Field of Classification Search .................. 257/40, 257/88, 787, 433, E25.032, 100
   See application file for complete search history.

(56) References Cited

U.S. PATENT DOCUMENTS

| 5,811,177 | A | 9/1998 | Shi et al. |
| 6,019,932 | A | 2/2000 | Kambara |
| 6,198,220 | B1 * | 3/2001 | Jones et al. ................ 313/512 |
| 6,319,321 | B1 | 11/2001 | Hiraga et al. |
| 6,429,584 | B2 | 8/2002 | Kubota |
| 6,548,912 | B1 * | 4/2003 | Graff et al. ................ 257/787 |
| 6,781,162 | B2 * | 8/2004 | Yamazaki et al. .......... 257/184 |
| 6,864,629 | B2 | 3/2005 | Miyaguchi et al. |
| 6,903,377 | B2 * | 6/2005 | Yamazaki et al. .......... 257/88 |
| 7,157,842 | B2 | 1/2007 | Yao |
| 7,183,580 | B2 | 2/2007 | Hayashi et al. |
| 2002/0044111 | A1 * | 4/2002 | Yamazaki et al. .......... 345/83 |
| 2003/0085654 | A1 | 5/2003 | Hayashi |
| 2003/0122140 | A1 * | 7/2003 | Yamazaki et al. .......... 257/88 |
| 2004/0124770 | A1 | 7/2004 | Hayashi et al. |
| 2004/0212759 | A1 | 10/2004 | Hayashi |

(Continued)

FOREIGN PATENT DOCUMENTS

| JP | A 01-283937 | 11/1989 |
| JP | A 09-185994 | 7/1997 |
| JP | A-10-202153 | 8/1998 |
| JP | A-11-40590 | 2/1999 |
| JP | A 2000-223264 | 8/2000 |

(Continued)

*Primary Examiner*—Nitin Parekh
(74) *Attorney, Agent, or Firm*—Oliff & Berridge, PLC

(57) ABSTRACT

An organic electroluminescent device, which, on a substrate, has a plurality of first electrodes, and a second electrode opposing the plurality of first electrodes. The organic electroluminescent device also including a light-emitting functional layer between the second electrode and one of the first electrodes and a buffering layer that covers the second electrode. The buffering layer having a side end portion with an angle equal to or less than 30°. The organic electroluminescent device further including a gas barrier layer that covers the buffering layer.

4 Claims, 13 Drawing Sheets

U.S. PATENT DOCUMENTS

| | | |
|---|---|---|
| 2005/0084214 A1 | 4/2005 | Hayashi et al. |
| 2005/0110020 A1 | 5/2005 | Hayashi et al. |
| 2005/0139821 A1* | 6/2005 | Park .......................... 257/40 |
| 2006/0088951 A1 | 4/2006 | Hayashi et al. |
| 2006/0158111 A1 | 7/2006 | Hayashi |
| 2007/0111396 A1 | 5/2007 | Hayashi et al. |
| 2007/0132381 A1 | 6/2007 | Hayashi et al. |
| 2008/0054785 A1 | 3/2008 | Hayashi |

FOREIGN PATENT DOCUMENTS

| | | |
|---|---|---|
| JP | A-2000-299341 | 10/2000 |
| JP | A 2001-284041 | 10/2001 |
| JP | A-2002-329736 | 11/2002 |
| JP | A 2003-017244 | 1/2003 |
| JP | A-2003-110245 | 4/2003 |
| JP | A 2003-142255 | 5/2003 |
| JP | A 2004-127606 | 4/2004 |
| JP | A 2004-127608 | 4/2004 |
| JP | A 2004-146244 | 5/2004 |
| JP | A-2004-186525 | 7/2004 |
| JP | A-2004-272199 | 9/2004 |
| JP | A 2004-310053 | 11/2004 |

* cited by examiner

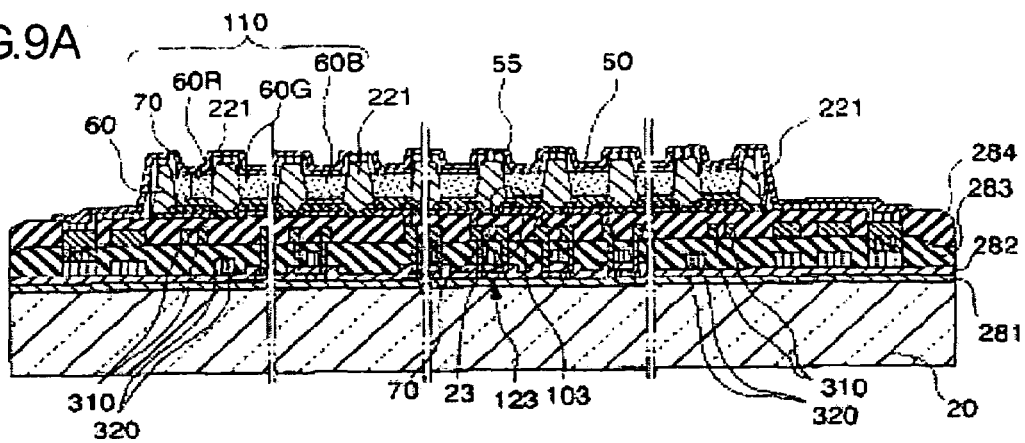
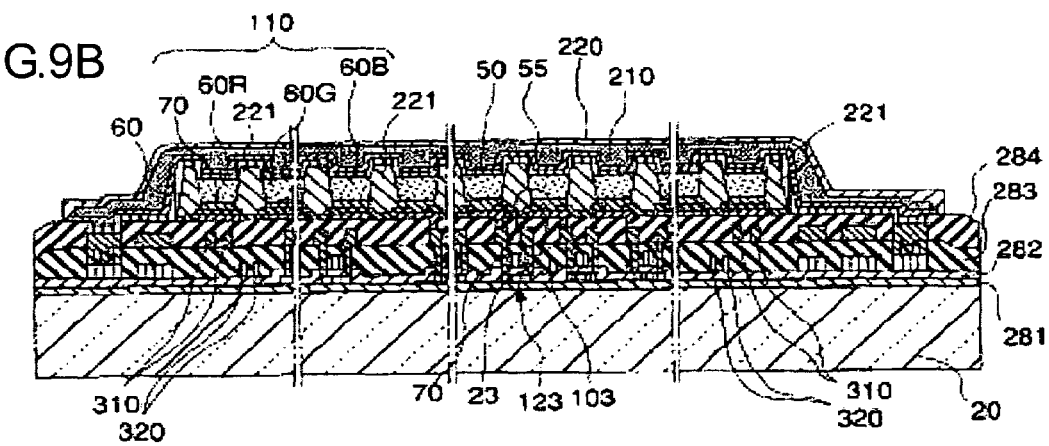
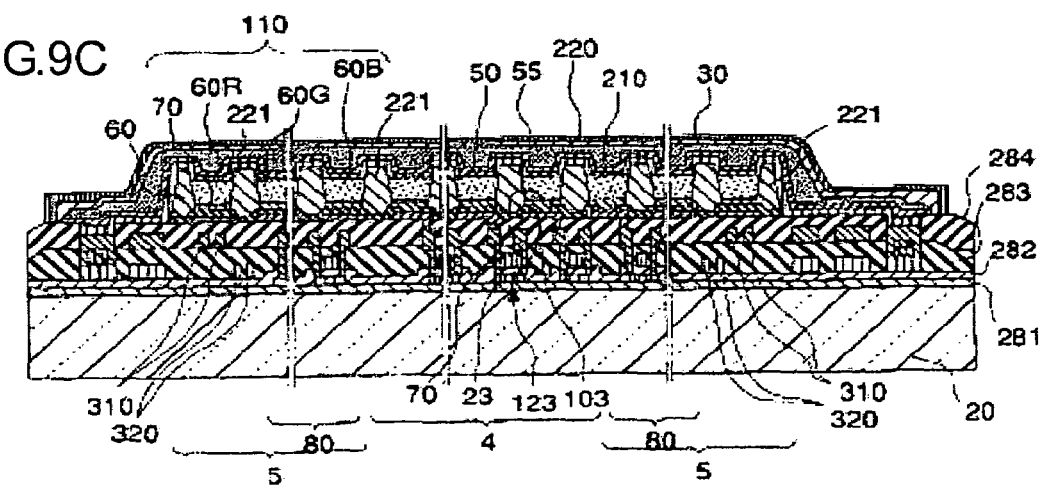

METHOD OF MANUFACTURING ORGANIC ELECTROLUMINESCENT DEVICE AND ORGANIC ELECTROLUMINESCENT DEVICE

INCORPORATED BY REFERENCE

This is a Division of application Ser. No. 11/243,411 filed Oct. 5, 2005. The disclosure of the prior application is hereby incorporated by reference herein in its entirety. This nonprovisional application claims the benefit of Japanese Patent Application No. 2004-307756, filed Oct. 22, 2004 and No. 2005-209534, filed Jul. 20, 2005. The entire disclosure of the prior applications are hereby incorporated by reference herein in its entirety.

BACKGROUND

The present invention relates to a method of manufacturing an organic electroluminescent device and an organic electroluminescent device.

In recent years, an organic electroluminescent device (hereinafter, referred to as an organic EL device) having a light-emitting functional layer has been known. Such an organic EL device generally has the configuration in which an organic light-emitting layer is provided between an inorganic anode and an inorganic cathode. In addition, in order to enhance hole-injection property or electron-injection property, the configuration in which an organic hole-injecting layer is disposed between the inorganic anode and the organic light-emitting layer or the configuration in which an electron-injecting layer is disposed between the organic light-emitting layer and the inorganic cathode has been suggested.

Here, the electron-injecting layer having material property ready to emit electrons is liable to react with moisture in air. With the reaction with water, the electron injection effect of the electron-injecting layer is degraded, and thus a non-light-emitting portion, which is called a dark spot, is formed, and lifetime of a light-emitting element is decreased. Accordingly, in a field of such an organic EL device, durability against moisture or oxygen needs to be enhanced.

In order to solve this problem, a method has been generally used in which a cover made of glass or a metal is attached to a substrate of a display device so as to seal against moisture or the like. However, as a display has a large screen and is reduced in size and weight, in order to hold the strength against external stress, the change from a hollow structure to a solid structure is demanded. Further, as the display becomes large, in order to ensure sufficient areas for TFTs or wiring circuits, a top emission structure, in which light is emitted from an opposite side to a circuit board, has been suggested. In order to meet such a demand, as a sealing structure, a thin structure, which is transparent and light-weight and has excellent strength, needs to be used. Further, even when a desiccant agent is removed, a structure capable of obtaining moisture-proof performance is demanded.

In recent years, in order to meet a display device, which has a large screen and is reduced in weight and thickness, a technology has been used in which a transparent thin film made of silicon nitride, silicon oxide, ceramics, or the like having excellent gas barrier property is film-deposited on the light-emitting element by use of a high-density plasma film-deposition method (for example, ion plating, ECR plasma sputter, ECR plasma CVD, surface acoustic wave plasma CVD, ICP-CVD, or the like) (for example, JP-A-9-185994, JP-A-2001-284041, JP-A-2000-223264, and JP-A-2003-17244). This technology is called a thin-film sealing method.

By forming the gas barrier layer using such a technology, the thin film can be formed such that moisture is completely blocked.

The gas barrier layer is made of an inorganic film, which is extremely hard at high density, in order to have moisture blocking property. For this reason, if an uneven portion or a steep step exists at the surface of the thin film, external stress is concentrated, and thus a crack or removal may occur. Accordingly, in order to suppress the crack or removal due to stress, a buffering layer needs to be disposed to come into contact with the gas barrier layer so as to enhance adherence to the gas barrier layer and to realize planarization. As such a buffering layer, it is preferable to use a material having planarization property, flexibility and stress-absorbing property. For example, an organic high-molecular-weight material is suitably used.

However, the inventors has confirmed that, even when the technologies described in the above-described publications are used and the buffering layer is disposed, sufficient light-emitting properties or light-emitting lifetime are not obtained and a non-light-emitting region is generated. In particular, in order to ensure planarization property of the buffering layer, a process of coating the planar buffering layer with no loss is needed, without causing bubbles or the like, since the buffering layer cannot spread out by the weight caused by the contact with the substrate, unlike a bonding adhesive. It is very important for a high-quality gas barrier layer to be provided.

SUMMARY

An advantage of some aspects of the invention is that it provides a method of manufacturing an organic EL device which can obtain sufficient light-emitting properties or light-emitting lifetime and suppress a non-light-emitting region from being generated, an organic EL device, and an electronic apparatus.

The inventors have paid attention to a coating method of the buffering layer and have achieved the invention.

Specifically, as the coating method of the buffering layer, in general, a liquid material, in which a solvent is mixed with an organic material, such as acryl or the like, is prepared and the liquid material is coated. Accordingly, the organic material having high viscosity has low viscosity, and, by coating the liquid material, uneven portions of banks or the like are buried and the surface of the buffering layer is formed planarly and uniformly. Then, by forming a gas barrier layer on such a buffering layer, the thin film is formed planarly and uniformly.

However, the inventors have found that, in such a coating method of a buffering layer, the solvent remains in the buffering layer under a low-temperature process condition, in which the respective layers of the organic functional layer, such as the light-emitting functional layer or the like, are not changed in quality. In addition, the inventors have confirmed that, even when a sufficient drying process is performed so as to remove the solvent after the formation of the buffering layer, the solvent cannot be completely removed from the buffering layer. Then, the inventors have found that the solvent remaining in the buffering layer penetrates the light-emitting functional layer, which causes degradation of light-emitting properties of the light-emitting functional layer, short light-emitting lifetime, and occurrence of a non-light-emitting region.

Further, the inventors have examined a case of coating the organic material without using the solvent, but have found that it is difficult to planarize the surface of the organic material having high viscosity, as compared with the material having low viscosity. Further, the inventors have confirmed that air caught at the time of coating penetrates and, when the organic material having high viscosity is buried into the uneven portion of the partition or the like, bubbles tend to be mixed in the vicinity of an interface at the time of covering the uneven portion. Then, it has been confirmed that when the bubbles exit from the surface of the organic material, crater-shaped coating-exit portions formed when the bubbles explode are formed and these shapes remain. Accordingly, in the organic material having high viscosity, planarization is difficult to perform and a buffering layer having a surface of the coating-exit portions is formed. Then, it has been found that the gas barrier layer also has an uneven shape, and thus it is difficult to form the gas barrier layer planarly and uniformly. In this case, in the gas barrier layer, external stress may be concentrated or a crack or removal tends to occur.

Further, the inventors have found that gas components of the bubbles remaining in the buffering layer may penetrate the light-emitting functional layer, and thus light-emitting properties of the light-emitting functional layer may be degraded, light-emitting lifetime may be shortened, and a non-light-emitting region may occur.

Further, the inventors have found that, according to the combination of the material constituting the buffering layer and the material constituting the electron-injecting layer, a low-viscosity material dissolves, which causes the dark spot of the electron-injecting layer.

Therefore, the inventors have achieved the invention having the following units on the basis of the above description.

That is, according to an aspect of the invention, there is provided a method of manufacturing an organic EL device, which, on a substrate, has a plurality of first electrodes, a light-emitting functional layer disposed to correspond to formation positions of the first electrodes, and a second electrode covering the light-emitting functional layer. The method of manufacturing an organic electroluminescent device includes forming a buffering layer that covers the second electrode, and forming a gas barrier layer that covers the buffering layer. The forming of the buffering layer includes coating a coating material containing a monomer/oligomer material and a curing agent under a vacuum atmosphere, without a solvent, and thermally curing the coating material so as to form the buffering layer.

According to this configuration, the monomer/oligomer material and the curing agent coated through the coating are cured through the thermally curing the coating material, thereby forming the buffering layer.

Here, since the coating is performed under the vacuum atmosphere, the coating is performed under an atmosphere in which moisture or oxygen is removed, thereby suppressing moisture or oxygen from penetrating the buffering layer. Further, since the coating is performed without using a solvent, the solvent does not remain in the buffering layer. Therefore, since moisture or oxygen almost never remains and solvent particles do not exist in the buffering layer, it is possible to suppress degradation of light-emitting properties, short light-emitting lifetime, and the occurrence of the non-light-emitting region caused by the penetration of moisture or oxygen into the light-emitting functional layer.

Further, in the thermally curing, since the monomer/oligomer material is cured by use of the curing agent, the monomer or oligomer is crosslinked, and thus a buffering layer made of a high-molecular-weight organic material (polymer) can be formed. Further, for the thermally curing, a thermally curing method by a heat treatment is preferably used. If doing so, the buffering layer can be formed by curing the coating material and also an inclined portion can be formed in a side end portion of the buffering layer by melting (softening) a peripheral portion of the buffering layer is melted (softened) with heat. Accordingly, since the gas barrier layer to be formed above the buffering layer is formed soft according to the shape of the buffering layer, gas barrier property can be enhanced.

Further, the total thickness of the gas barrier layer and the buffering layer, which are laminated by such a manufacturing method, can be reduced, as compared with the related art. Therefore, in an organic EL device of the invention, a thin-film sealing structure can be implemented, without forming a thick film.

Moreover, in the invention, as the light-emitting functional layer, any one of a low-molecular-weight material and a high-molecular-weight material can be used.

Further, the method of manufacturing an organic EL device according to the aspect of the invention may further include forming a partition that has a plurality of openings corresponding to the formation positions of the first electrodes, forming the light-emitting functional layer in the plurality of openings, and forming the second electrode that covers the partition and the light-emitting functional layer. The forming of the buffering layer may form the buffering layer to cover the second electrode and the partition.

According to this configuration, since the partition having the openings is formed, a high-molecular-weight light-emitting functional layer can be formed in the openings by use of a wet film-deposition method, such as a liquid droplet ejecting method or the like. Therefore, the high-molecular-weight light-emitting functional layer can be coated and formed only in the openings. Further, in addition to the above-described advantage, the light-emitting functional layer can be formed by use of the wet film-deposition method.

Further, in the method of manufacturing an organic EL device according to the aspect of the invention, it is preferable that, in the forming of the buffering layer, the coating be performed by use of a screen printing method. Further, in the method of manufacturing an organic EL device according to the aspect of the invention, it is preferable that the screen printing method sequentially perform dropping the coating material on an aperture area of a mask, pressing and moving the coating material onto the aperture area of the mask by a squeegee so as to form the coating film made of the coating material on the substrate, and removing the mask from the coating film.

According to this configuration, as described above, the screen printing method is performed under the vacuum atmosphere, and thus the coating material can be coated and formed on the substrate by use of the screen printing method. Therefore, it is possible as much as possible to suppress the light-emitting functional layer from being damaged due to the penetration of moisture or oxygen in air caught at the time of coating. Further, it is possible to prevent the absorption of moisture onto the surface of the substrate before coating.

Further, by using the screen printing method, a stable film thickness is ensured and the bubble is removed, and thus the planarization of the buffering layer can be performed. In addition, by coating with a screen mesh and an emulsion mask, precision and a degree of freedom of a predetermined patterning shape can be increased.

Further, by planarizing the surface of the buffering layer, the overlying gas barrier layer has uniform film quality, and thus the uniform gas barrier layer with no defects can be formed.

Further, in the method of manufacturing an organic EL device according to the aspect of the invention, it is preferable that the removing the mask from the coating film remove the mask from the coating film while inclining the mask with respect to the substrate.

According to this configuration, at an interface where the coated film and the mask come into contact with each other, the mask can be slowly removed while linearly moving from one to the other, without concentrating force onto one point. On the contrary, when the mask is removed, without inclining the mask, in a state in which the substrate and the mask are substantially disposed in parallel with each other, repulsive power of the mask itself caused when the mask is removed is concentrated onto one point of an electrode (cathode) of a central portion which has low adherence, which causes the electrode to be removed.

Therefore, as described above, by removing the mask while being inclined with respect to the substrate, the removal of the electrode can be prevented, and, with the oblique removal, the removal speed of the mask can be made constant. As a result, a uniform coated film can be formed, and the planarization of the surface of the buffering layer formed after the thermally curing can be realized.

Further, the mask is preferably made of a flexible plate, which is prepared by knitting resin or metal fibers, called a screen mesh. In this case, in the vicinity of a boundary of a contact surface of the coated film, with which the mask comes into contact, and an exposed surface of the coated film, the mask can be removed while being curved. Accordingly, force acting on the substrate can be dispersed at the time of removing the mask, and a removal angle to the coated film can be suppressed small. Therefore, the bubbles can be suppressed small, without exploding, and thus the bubbles can be easily defoamed in a subsequent defoaming. As a result, the same advantages as those described above can be obtained.

Further, in the method of manufacturing an organic EL device according to the aspect of the invention, it is preferable that the forming of the buffering layer have defoaming between the coating the coating material and the thermally curing the coating material, and the defoaming is performed under an inert gas atmosphere of a pressure higher than that in the coating the coating material.

Here, though the above-described coating is performed under the vacuum atmosphere, when the coating material is transferred while the mask is pressed with a coating unit and when stirring at the time of the movement of the coating unit or when the mask is separated from the substrate just after coating, the bubbles in vacuum states may be mixed into the coating material. Therefore, by performing the defoaming under the inert gas atmosphere of a pressure higher than that in the coating the coating material, a pressure is given to the buffering layer (the coated film before curing) by an external pressure of the inert gas atmosphere, and the bubbles in the vacuum states shrink to be made infinitesimal. Further, in the bubbles shrunk and made infinitesimal in such a manner, gas almost never exists, and an influence is exerted on the light-emitting functional layer. Then, the bubbles in the buffering layer are made infinitesimal, and thus the surface of the buffering layer is planarized. Further, there is no case in which crater-shaped coating-exit uneven portions caused by the explosion of the bubbles are formed at the surface of the buffering layer.

Further, in the method of manufacturing an organic EL device according to the aspect of the invention, it is preferable that the forming of the buffering layer form a marginal portion of a planar pattern of the buffering layer in a wavy shape.

According to this configuration, the marginal length of the planar pattern of the buffering layer is increased, as compared with the case in which the marginal portion is a linear shape. Accordingly, adhesion to the film (the gas barrier layer) above the buffering layer can be enhanced, and stress of the buffering layer in the marginal portion can be dispersed. Then, the film strength of the buffering layer can be enhanced and high reliability can be realized. Since such a wavy shape can be desirably defined by the mask shape of the screen printing method, the wavy shape can be easily formed, without adding a process for forming the wavy shape.

Further, the inventors have compared the case in which the marginal portion of the planar pattern of the buffering layer is a linear shape to the case in which the marginal portion is a wavy shape, and have confirmed that dark spots or non-light-emitting portions occur in the case of the linear shape and entire surface light-emission can be realized in the wavy shape, without causing dark spots or non-light-emitting portions.

Further, in the method of manufacturing an organic EL device according to the aspect of the invention, it is preferable that, in the forming of the buffering layer, the coating material contain an epoxy-based monomer/oligomer material having a molecular weight of 3000 or less, and the coating material be cured by ester binding after the thermally curing the coating material so as to form the buffering layer.

Here, as described above, in the invention, the buffering layer is formed with no solvent, and thus the monomer/oligomer material needs to be coated and formed in a state of low viscosity. Then, a material, which easily forms a polymer film by the thermally curing even when a low-molecular-weight monomer is used, is used. As such a material, an epoxy-based material is suitably used.

Further, when comparing the epoxy-based material to the acryl-based material, which was used as the material for the buffering layer in the related art, the acryl-based material has a defect in that shrinkage tends to occur when monomer/oligomer is cured into polymer. On the contrary, the epoxy-based material has an advantage in that the film is easily formed from monomer/oligomer, which is a low-molecular-weight material, while suppressing the shrinkage of the film.

Further, as the curing agent, acid anhydride is preferably used. If the epoxy-based monomer/oligomer is cured with acid anhydride, three-dimensionally dense ester binding is formed, and the buffering layer made of a high-molecular-weight organic material having high hardness and excellent thermal resistance, water resistance, and electrical insulation can be formed. Then, the buffering layer has resistance against a high-density plasma process for forming the gas barrier layer made of an inorganic material, and thus a high-density gas barrier layer can be formed with no loss. Further, by curing the coating material with acid anhydride in such a manner, high-polarity ester binding is formed with high density, and thus adherence to the gas barrier layer, which is made of a different material, can be enhanced.

Further, in the method of manufacturing an organic EL device according to the aspect of the invention, it is preferable that room-temperature viscosity of the coating material be in a range of 500 to 20000 mPa·s.

Here, in the screen printing method, if a material diluted by a material having low viscosity or a solvent is coated, ooze or penetration occurs between the mask and the substrate, and thus it is difficult to hold the shape. Further, in a case of a material having high viscosity, uneven shapes of the mask or bubbles remains at the surface, and it is difficult to realize planarization. Accordingly, when the screen printing method is performed, in order to hold a suitable shape and perform planarization of the surface, the coating material preferably has viscosity in any range.

Therefore, the inventors have confirmed on an experimental basis that, if viscosity is equal to or less than 500 mPa·s, the material is pushed up to an emulsion portion, and the shape of the buffering layer is difficult to hold and a sufficient film thickness is not obtained. Further, if the viscosity is equal to or more than 20000 mPa·s, it has been confirmed that a large bubble remaining in the buffering layer is difficult to return, the film thickness is excessively increased, and a low-angle state of the side end portion cannot be ensured. For example, if a pressure is increased after the coating material is coated and formed in a vacuum, the bubble is made infinitesimal when the coating material has low viscosity. When the coating material has high viscosity, however, a large bubble tends to remain. Then, the bubble is not reduced in size, and the shape thereof is maintained as it is. Accordingly, the bubble in the film is not defoamed and a residual trace occurs. Further, if viscosity becomes high, the film thickness is excessively increased, and thus the angle of the side end portion is steepened.

Therefore, by setting the room-temperature viscosity of the coating material in the range of 500 to 20000 mPa·s, the above-described problems can be solved, and the shape of the buffering layer can be held. In addition, planarization of the surface, the infinitesimal bubble, and the low-angle side end portion can be realized.

Further, in the method of manufacturing an organic EL device according to the aspect of the invention, it is preferable that the room-temperature viscosity of the coating material be in a range of 1000 to 10000 mPa·s.

According to the knowledge of the inventors, it has been confirmed that, in the case of the room-temperature ranging from 1000 to 10000 mPa·s, the above-described advantages can be further accelerated, rather than the case of the room-temperature ranging from 500 to 20000 mPa·s.

Specifically, when the room-temperature viscosity exceeds 10000 mPa·s, it has been found a problem in that the bubbles of the buffering layer remain. Further, when the room-temperature viscosity does not satisfy 1000 mPa·s, it has been found a problem in that the bubbles split open, the crater tends to occur, and a uniform film is not obtained. Further, it has been confirmed that the dark spots drastically occur.

Therefore, by setting the room-temperature viscosity of the coating material in the range of 1000 to 10000 mPa·s, the shape of the buffering layer can be held, and planarization of the surface, the infinitesimal bubbles, and the low-angle side end portion can be reliably realized. Further, the dark spots can be suppressed from causing.

Further, in the method of manufacturing an organic EL device according to the aspect of the invention, it is preferable that the film thickness of the buffering layer be in a range of 3 to 10 μm.

By setting the film thickness of the buffering layer to this range, the shape of the buffering layer can be held, and planarization of the surface, the infinitesimal bubbles, and the low-angle side end portion can be reliably realized. Further, the dark spots can be suppressed from causing.

Further, in the method of manufacturing an organic EL device according to the aspect of the invention may further include forming an organic adhering layer having an oxygen atomic weight more than that of the buffering layer between the buffering layer and the gas barrier layer.

The organic adhering layer is formed on the outermost surface of the buffering layer in a thin film, and thus the organic adhering layer may be formed by oxidizing the surface of the buffering layer by a plasma treatment or the like. By forming the organic adhering layer in such a manner, a cleaning effect to the surface of the buffering layer and surface energy are increased, and thus adherence between the buffering layer and the gas barrier layer can be enhanced. Therefore, the gas barrier layer can be suppressed from being removed, and durability of the organic EL device can be enhanced.

Further, in the method of manufacturing an organic EL device according to the aspect of the invention, it is preferable that the angle of a side end portion of the buffering layer be equal to or less than 30°.

Here, if the angle of the side end portion is steep, it is difficult to cover the gas barrier layer with respect to the buffering layer, and stress acting on the side end portion becomes large according to expansion and contraction of the buffering layer caused by temperature variation. The inventors have confirmed that, by setting the angle to be equal to or less than 30°, when the gas barrier layer is formed above the buffering layer, the gas barrier layer can be film-deposited to have a uniform thickness. Further, it has been confirmed that, by dispersing stress acting on the side end portion, the gas barrier layer can be prevented from being damaged. Therefore, gas barrier property with respect to the side end portion of the buffering layer can be reliably obtained.

In order to set the angle of the side end portion to be equal to or less than 30°, preferably, viscosity is set to a predetermined value, and a heat treatment at a temperature higher than a temperature at the time of coating is performed as the curing. If doing so, the peripheral portion of the buffering layer is melted (softened) by heat, and then the inclined portion of 30° can be formed in the side end portion of the buffering layer. Accordingly, the gas barrier layer formed above the buffering layer is formed soft according to the shape of the buffering layer, and thus gas barrier property can be enhanced.

Further, the method of manufacturing an organic EL device according to the aspect of the invention may further include forming an electrode protecting layer between the second electrode and the buffering layer.

The electrode protecting layer protects the electrode from the coating process of the buffering layer and a surface having high surface energy is formed, without depending on an electrode material. Therefore, planarization or defoaming property at the time of coating and forming the buffering layer can be enhanced, and adherence to the buffering layer can be obtained.

Further, in the method of manufacturing an organic EL device according to the aspect of the invention, it is preferable that the electrode protecting layer and the gas barrier layer be made of a silicon oxynitride film, and the buffering layer contain an epoxy-based compound and a silane coupling agent.

The inventors have found that, according to the combination of the material constituting the buffering layer and the material constituting the electron-injecting layer in a low-molecular-weight-based organic EL device, the low-viscosity material of buffering layer components before curing is dissolved, which causes the dark spots of the electron-injecting layer. Then, with a close study, the inventors have found the combination of the material for the buffering layer and the material for the electron-injecting layer, which does not cause the dark spots. That is, by using silicon oxynitride for the electrode protecting layer and gas barrier layer and using the material containing the epoxy-based compound and the silane coupling agent for the buffering layer, the dark spots in the electron-injecting layer can be prevented from causing.

Further, in the method of manufacturing an organic EL device according to the aspect of the invention, it is preferable that the film thickness of the gas barrier layer be in a range of 300 to 700 nm.

The inventors have confirmed that, when the film thickness of the gas barrier layer is smaller than 300 nm, sufficient gas barrier property is not obtained. Further, it has been confirmed that, when the film thickness of the gas barrier layer is larger than 700 nm, internal stress is accumulated in the gas barrier itself, which causes the cracks. Accordingly, by defining the film thickness of the gas barrier layer, as described above, gas barrier property and crack-resistance property can be obtained.

Further, the method of manufacturing an organic EL device according to the aspect of the invention may further include bonding a formation surface of the gas barrier layer of the substrate and a protective substrate facing the formation surface. The bonding bonds the protective substrate and the substrate with an adhesive layer.

Here, the adhesive layer is a layer film for bonding the protective substrate and the substrate. Further, as described above, the thin-film sealing structure is realized with the gas barrier layer and the buffering layer, and thus the adhesive layer does not need to be increased in thickness.

According to this configuration, by bonding the protective substrate, the gas barrier layer or buffering layer, and the light-emitting functional layer can be prevented from being externally damaged. Further, pressure resistance or wear resistance, external light anti-reflection property, gas barrier property, ultraviolet blocking property, and the like can be realized.

Further, in the method of manufacturing an organic EL device according to the aspect of the invention, it is preferable that the protective substrate be a color filter substrate on which colored layers of a plurality of colors.

For example, the colored layers of the plurality of colors have red (R), green (G), and blue (B), and are disposed to face the light-emitting functional layer.

Further, the distance of the colored layer and the light-emitting functional layer needs to be formed as short as possible, such that light emitted from the light-emitting functional layer is emitted only to the light-emitting functional layer. This is because, when the distance is long, light emitted from the light-emitting functional layer may be emitted to adjacent colored layers. In order to suppress this problem, the distance is preferably shortened.

Then, in accordance with the aspect of the invention, since the thin-film sealing structure is realized by the above-described gas barrier layer or the buffering layer, the distance between the light-emitting functional layer and the colored layer is made short. Accordingly, light emitted from the light-emitting functional layer is emitted only to the colored layer facing the light-emitting functional layer, and thus light leakage to the adjacent colored layers can be suppressed.

Here, as an organic light-emitting layer included in the light-emitting functional layer, a white organic light-emitting layer generating a white light component is used or organic light-emitting layers for respective colors generating a plurality of color light components of RGB are used.

When the white organic light-emitting layer is used, the white light component is irradiated onto the colored layers of the plurality of colors, and thus the white light component can be color-coded for RGB. Further, in a mask vapor-deposition for forming a low-molecular-weight white organic light-emitting layer or a liquid droplet ejection for forming a high-molecular-weight white organic light-emitting layer, one kind of white organic light-emitting layer can be formed with a single process, and thus a manufacturing process can be facilitated, as compared with the case in which organic light-emitting layers are separately formed for RGB.

When the organic light-emitting layers for the respective colors are used, the respective color light components of RGB are irradiated onto the colored layers for the same color, thereby performing color correction.

Further, according to another aspect of the invention, an organic EL device includes, on a substrate, a plurality of first electrodes, a light-emitting functional layer that is disposed to correspond to formation positions of the first electrodes, a second electrode that covers the light-emitting functional layer, a buffering layer that is formed so as to cover the second electrode, and a gas barrier layer that covers the buffering layer. The organic EL device is manufactured by the method of manufacturing an organic EL device according to the aspect of the invention.

If doing so, a monomer/oligomer material and a curing agent coated through coating can be cured through thermally curing the coating material, thereby forming the buffering layer.

Here, since the coating is performed under the vacuum atmosphere, the coating is performed under an atmosphere in which moisture or oxygen is removed, thereby suppressing moisture or oxygen from penetrating the buffering layer. Further, since the coating is performed without using a solvent, the solvent does not remain in the buffering layer. Therefore, since moisture or oxygen almost never remains and solvent particles do not exist in the buffering layer, it is possible to suppress degradation of light-emitting properties, short light-emitting lifetime, and the occurrence of the non-light-emitting region caused by the penetration of moisture or oxygen into the light-emitting functional layer.

Further, in the thermally curing, since the monomer/oligomer material is cured by use of the curing agent, the monomer or oligomer is crosslinked, and thus a buffering layer made of a high-molecular-weight organic material (polymer) can be formed. Further, for the thermally curing, a thermally curing method by a heat treatment is preferably used. If doing so, the buffering layer can be formed by curing the coating material and also an inclined portion can be formed in a side end portion of the buffering layer by melting (softening) a peripheral portion of the buffering layer is melted (softened) with heat. Accordingly, since the gas barrier layer to be formed above the buffering layer is formed soft according to the shape of the buffering layer, gas barrier property can be enhanced.

Further, the layer thickness of the gas barrier layer and the buffering layer, which are laminated by such a manufacturing method, can be reduced, as compared with the related art. Therefore, in an organic EL device of the invention, a thin-film sealing structure can be implemented, without forming a thick film.

Moreover, in the invention, as the light-emitting functional layer, any one of a low-molecular-weight material and a high-molecular-weight material can be used.

Further, in the organic EL device according to another aspect of the invention, it is preferable that a marginal portion of a planar pattern of the buffering layer be formed in a wavy shape.

According to this configuration, the marginal length of a planar pattern of the buffering layer is increased, as compared with the case in which the marginal portion is a linear shape. Accordingly, adhesion to the underlying film (for example, the second electrode or electrode protecting layer) of the buffering layer can be enhanced, and stress of the buffering layer in the marginal portion can be dispersed. Then, the film strength of the buffering layer can be enhanced and high reliability can be realized. Since such a wavy shape can be desirably defined by the mask shape of the screen printing method, the wavy shape can be easily formed, without adding a process for forming the wavy shape.

Further, according to still another aspect of the invention, an electronic apparatus includes the organic EL device according to another aspect of the invention.

As such an electronic apparatus, for example, an information processing device, such as a cellular phone, a mobile information terminal, a watch, a word processor, a personal computer, or the like, a printer, or the like can be exemplified. Further, a television having a large display screen, a large monitor, or the like can be exemplified. As such, by using the organic EL device of the invention for a display unit of the electronic apparatus, an electronic apparatus, which includes a display unit having long lifetime and favorable display characteristics, can be provided. Further, the organic EL device can be applied to a light source of a printer or the like.

BRIEF DESCRIPTION OF THE DRAWINGS

The invention will be described with reference to the accompanying drawings, wherein like numbers reference like elements.

FIG. 9A is a diagram showing a manufacturing method of the organic EL device according to the first embodiment of the invention in a process sequence.

FIG. 9B is a diagram showing a manufacturing method of the organic EL device according to the first embodiment of the invention in a process sequence.

FIG. 9C is a diagram showing a manufacturing method of the organic EL device according to the first embodiment of the invention in a process sequence.

DETAILED DESCRIPTION OF EMBODIMENTS

Hereinafter, embodiments of a method of manufacturing an organic EL device, an organic EL device, and an electronic apparatus of the invention will be described with reference to the drawings.

Moreover, in the following description, the scale of each member or each layer film has been adjusted in order to have a recognizable size.

First Embodiment of Organic EL Device

Figure 1:
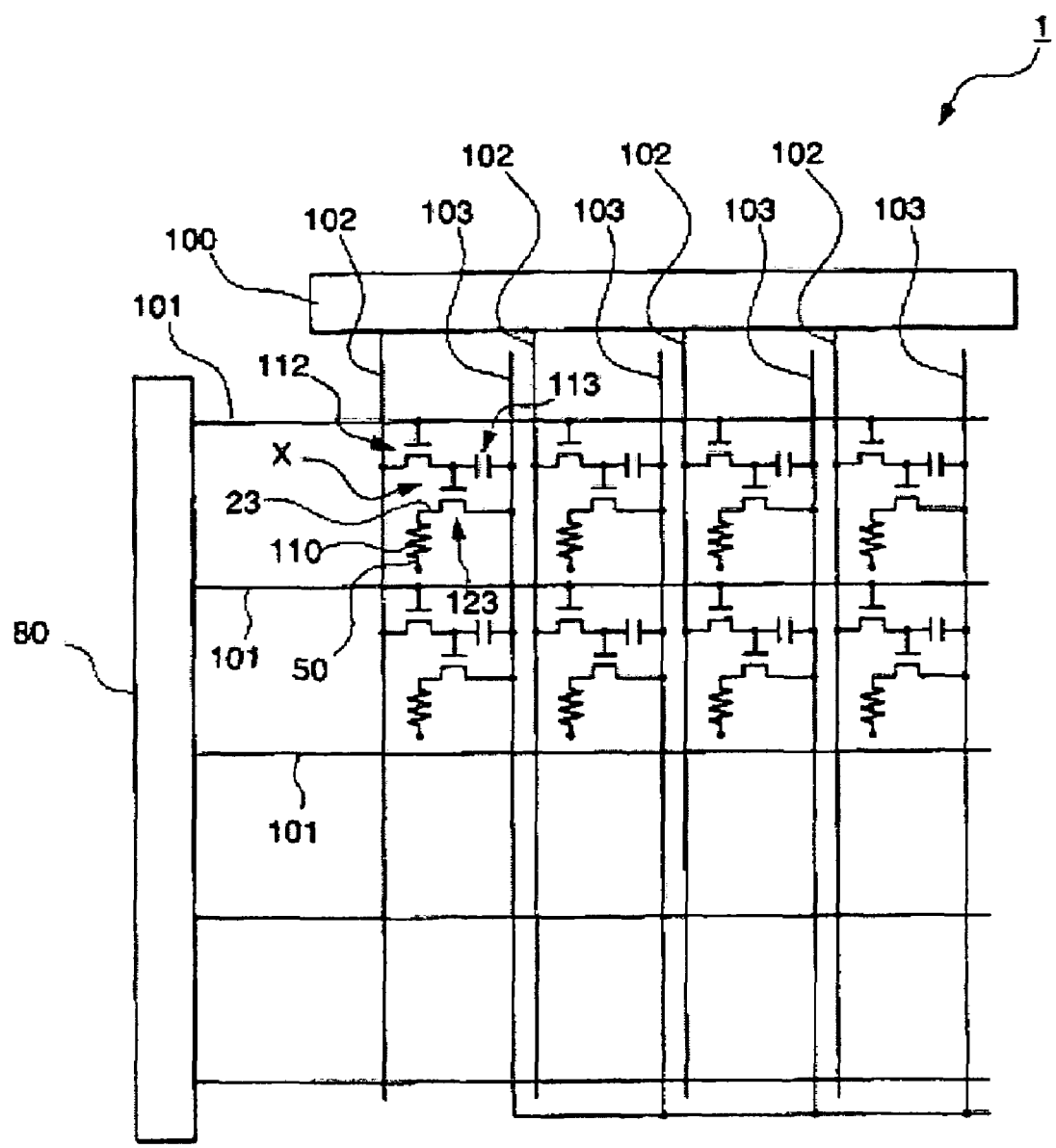
FIG. 1 is a diagram showing a wiring line structure of an organic EL device according to a first embodiment of the invention.

FIG. 1 is a diagram showing a wiring structure of an organic EL device 1 according to a first embodiment of the invention.

The organic EL device 1 is an active matrix type organic EL device in which a thin film transistor (hereinafter, referred to as TFT) is used as a switching element.

As shown in FIG. 1, the organic EL device 1 has a configuration in which a plurality of scanning lines 101, a plurality of signal lines 102 extending in a direction orthogonal to the respective scanning lines 101, and a plurality of power lines 103 extending in parallel with the respective signal lines 102 are wired, and pixel regions X are provided in the vicinities of intersections of the scanning lines 101 and the signal lines 102.

To the signal lines 102, a data line driving circuit 100 having shift registers, level shifters, video lines, and analog switches is connected. Further, to the scanning lines 101, a scanning line driving circuit 80 having shift registers and level shifters is connected.

In addition, each pixel region X is provided with a switching TFT 112 of which a gate electrode is supplied with a scanning signal via the scanning line 101, a storage capacitor 113 that holds a pixel signal supplied from the signal line 102 via the switching TFT 112, a driving TFT 123 of which a gate electrode is supplied with the pixel signal held by the storage capacitor 113, a pixel electrode (first electrode) 23 into which a driving current flows from the power line 103 when electrically connected to the power line 103 via the driving TFT 123, and a light-emitting functional layer 110 that is interposed between the pixel electrode 23 and a cathode (second electrode) 50. The pixel electrode 23, the cathode 50, and the light-emitting functional layer 110 constitute a light-emitting element.

According to this organic EL device 1, if the scanning line 101 is driven and the switching TFT 112 is turned on, the potential of the signal line 102 at that time is held in the storage capacitor 113. In addition, depending on a state of the storage capacitor 113, an on or off state of the driving TFT 123 is determined. Then, a current flows from the power line 103 into the pixel electrode 23 via a channel of the driving TFT 123, and the current flows into the cathode 50 via the light-emitting functional layer 110 (or organic light-emitting layer 60). The light-emitting functional layer 110 emits light depending on the amount of current flowing therethrough.

Next, a specified configuration of the organic EL device 1 will be described with reference to FIGS. 2 to 7.

Figure 2:
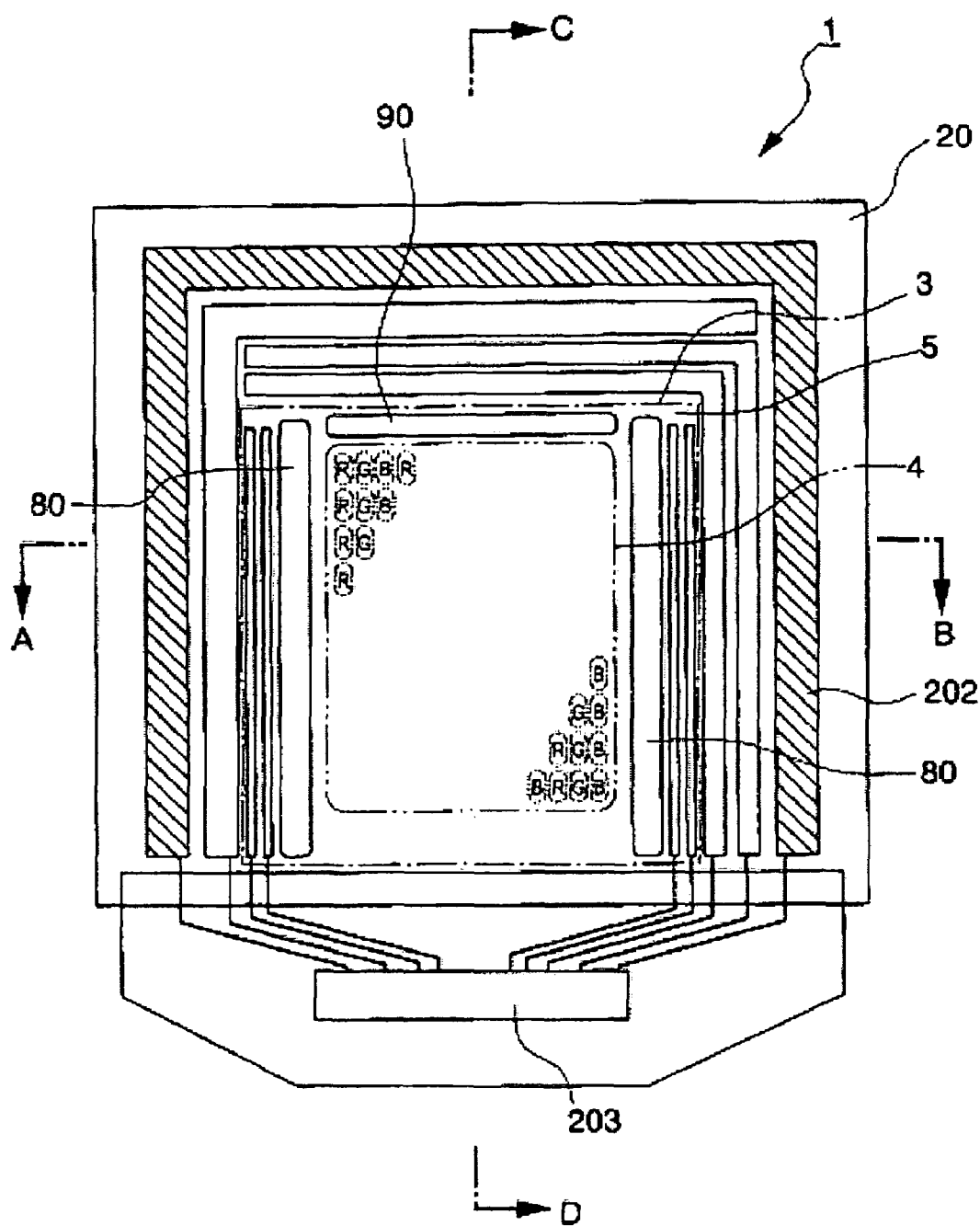
FIG. 2 is a schematic view showing a configuration of the organic EL device according to the first embodiment of the invention.
Figure 3:
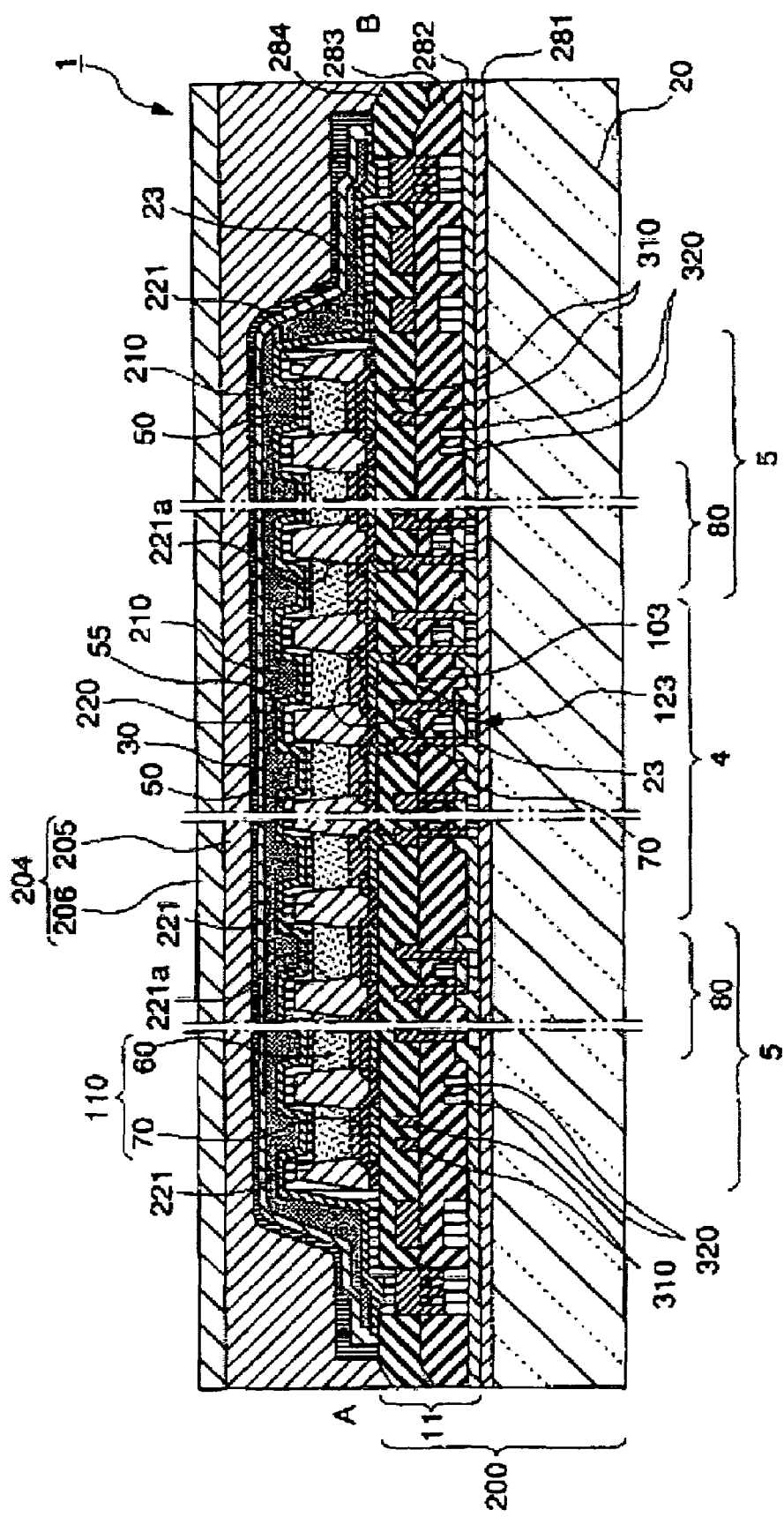
FIG. 3 is a cross-sectional view taken along the line III-III of FIG. 2.
Figure 4:
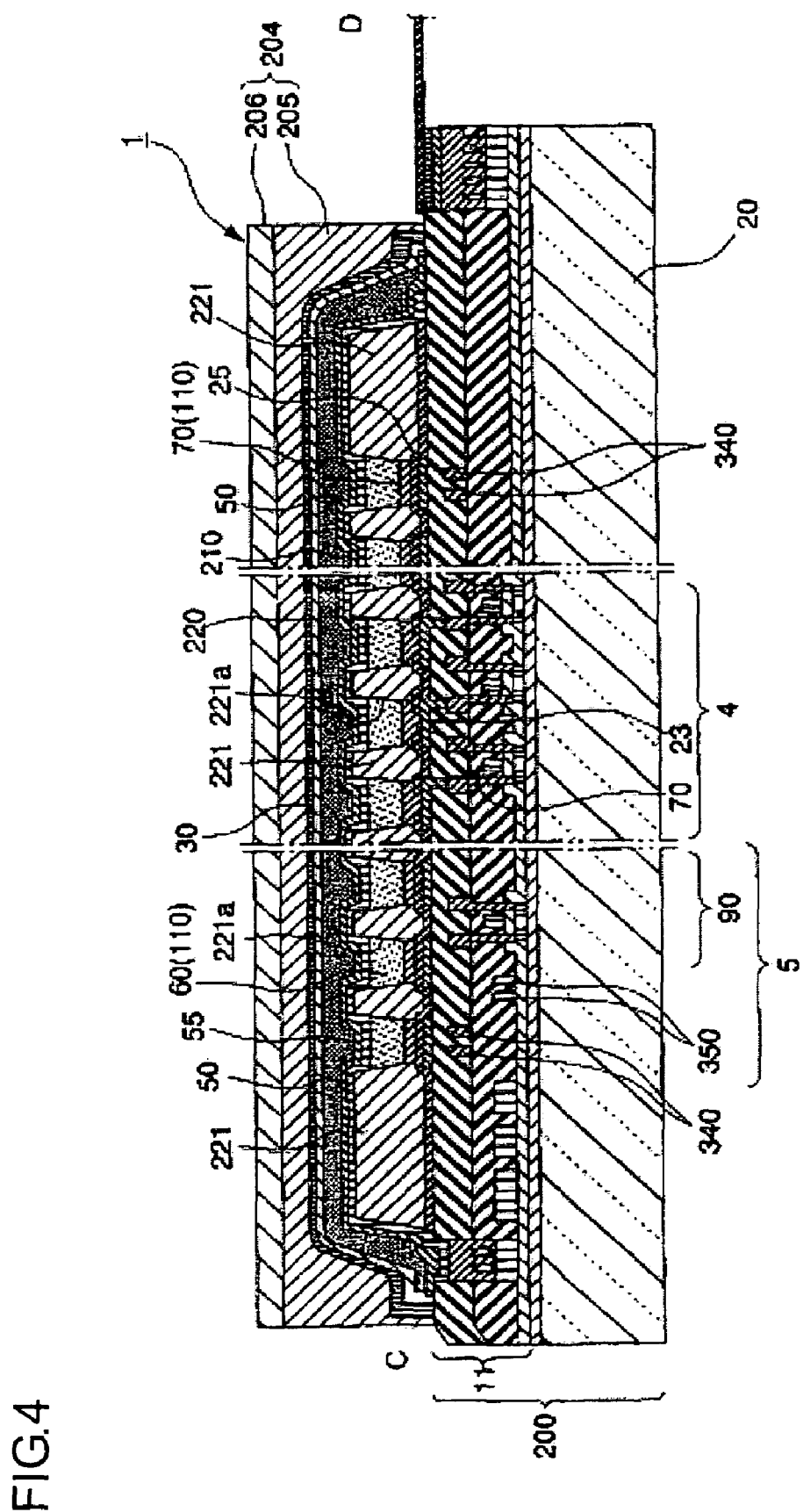
FIG. 4 is a cross-sectional view taken along the line IV-IV of FIG. 2.
Figure 5:
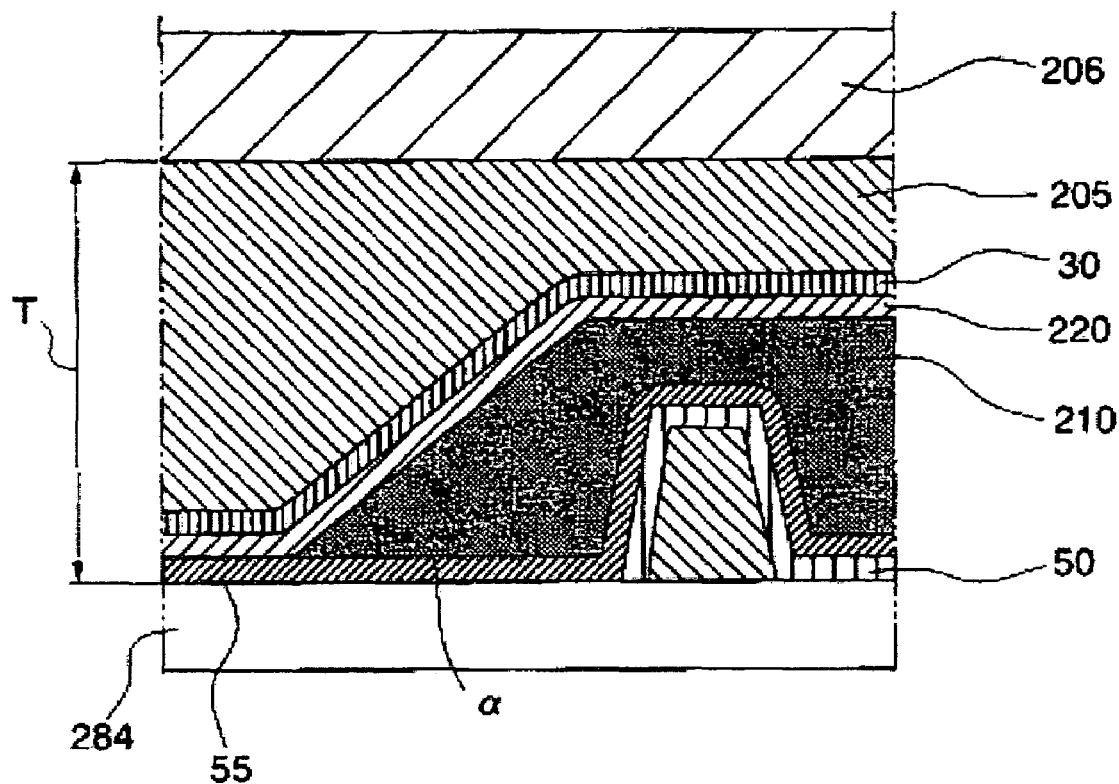
FIG. 5 is an expanded cross-sectional view showing essential parts of FIG. 3.
Figure 6:
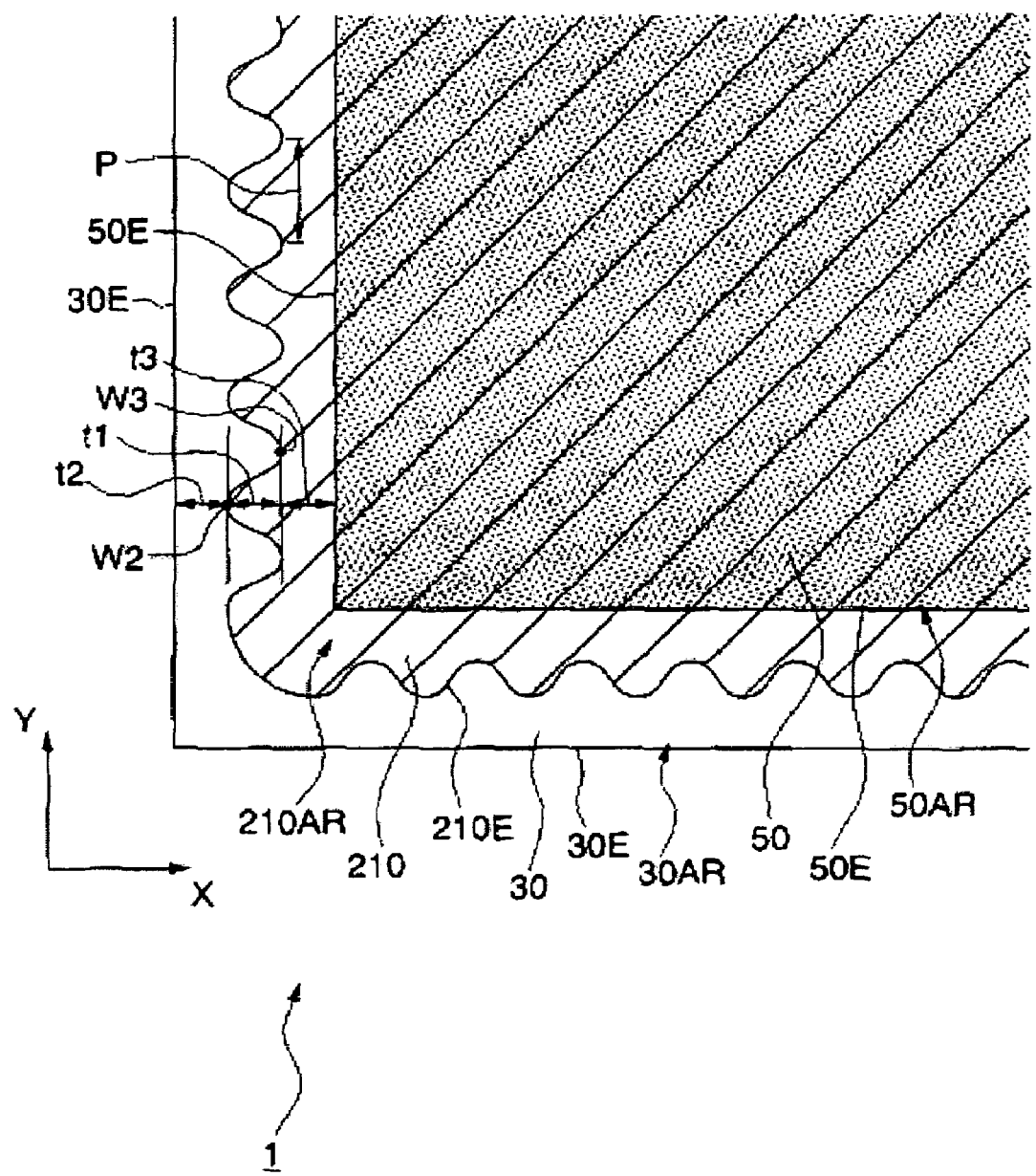
FIG. 6 is an expanded plan view showing essential parts of FIG. 2.
Figure 7:
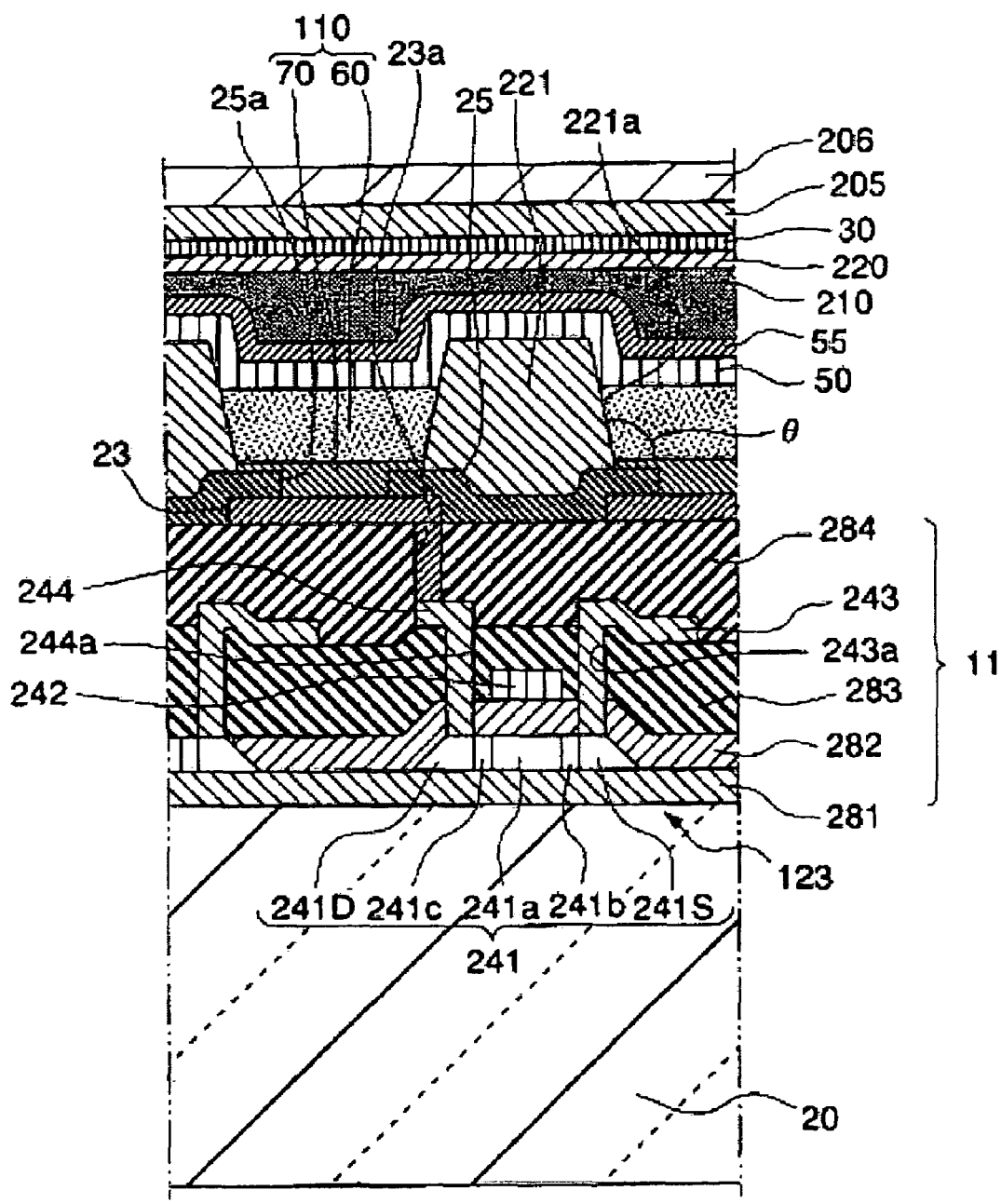
FIG. 7 is an expanded cross-sectional view showing essential parts of FIG. 3.

Here, FIG. 2 is a schematic view showing the configuration of the organic EL device 1. Further, FIG. 3 is a cross-sectional view of the organic EL device taken along the line III-III of FIG. 2 and FIG. 4 is a cross-sectional view of the organic EL device taken along the line IV-IV of FIG. 2. In addition, FIGS. 5 and 7 are expanded cross-sectional views of the essential parts of FIG. 3. FIG. 6 is an expanded plan view of the essential parts of FIG. 2.

As shown in FIG. 2, the organic EL device 1 is an active matrix-type which includes a substrate 20 having electrical insulation, a pixel electrode region (not shown) in which the pixel electrodes connected to the switching TFTs (not shown) are arranged in a matrix shape on the substrate 20, the power lines (not shown) arranged around the pixel electrode region and connected to the respective pixel electrodes, and a pixel portion 3 (in FIG. 2, within an one-dot-chain line box) being positioned on at least the pixel electrode region and having a substantially rectangular shape in plan view.

Moreover, in the invention, the substrate 20, and the switching TFT or various circuits, interlayer insulating films, and the like formed on the substrate 20, which are described below, are collectively referred to as a base substrate (which is represented by reference numeral 200 in FIGS. 3 and 4).

The pixel portion 3 is divided into an actual light-emitting region 4 (in FIG. 2, within a two-dot-chain line box) of a central portion and a dummy region 5 (a region between the one-dot-chain line and the two-dot-chain line) disposed in the vicinity of the actual light-emitting region 4.

In the actual light-emitting region 4, light-emitting regions R, G, and B each having the pixel electrode are disposed separately from one another in the directions of the lines III-III and IV-IV.

Further, on both sides of the actual light-emitting region 4 in FIG. 2, the scanning line driving circuits 80 and 80 are disposed. The scanning line driving circuits 80 and 80 are disposed below the dummy region 5.

In addition, on an upper side of the actual light-emitting region 4 in FIG. 2, a test circuit 90 is disposed. The test circuit 90 is a circuit for testing operating conditions of the organic EL device 1. For example, the test circuit 90 includes a test information output unit (not shown) that outputs test results to the outside. The test circuit 90 is constituted to test quality or defects of a display device during manufacture or at the time of shipment. Moreover, the test circuit 90 is also disposed below the dummy region 5.

Driving voltages of the scanning line driving circuits 80 and the test circuit 90 are applied from a predetermined power supply unit via a driving voltage connecting portion 310 (see FIG. 3) and a driving voltage connecting portion 340 (see FIG. 4). Further, driving control signals and driving voltages are transmitted and applied from a predetermined main driver for controlling the operation of the organic EL device 1 to the scanning line driving circuits 80 and the test circuit 90 via a driving control signal connecting portion 320 (see FIG. 3) and a driving voltage connecting portion 350 (see FIG. 4). Moreover, in this case, the driving control signals are instruction signals relating to controls at the time when the scanning line driving circuits 80 and the test circuit 90 output signals.

Further, in the organic EL device 1, as shown in FIGS. 3 and 4, a plurality of light-emitting elements each having a pixel electrode 23, a light-emitting functional layer 110, and a cathode 50 are formed on the base substrate 200. Further, a buffering layer 210, an organic adhering layer 220, a gas barrier layer 30, and the liker are formed to cover them. The pixel electrode 23 is provided for each light-emitting element, and the cathode 50 is provided commonly for the plurality of light-emitting elements. The pixel electrodes 23 are driven individually and thus the light-emitting elements emit light individually.

Further, as a representative of the light-emitting functional layer 110, an organic light-emitting layer (organic electroluminescent layer) 60 is exemplified, which has a carrier-injecting layer or a carrier-transporting layer, such as a hole-injecting layer, a hole-transporting layer, an electron-injecting layer, an electron-transporting layer, and the like. The organic light-emitting layer 60 may further have a hole-blocking layer and an electron-blocking layer.

In case of a so-called top-emission type organic EL device, since light is emitted from the gas barrier layer 30 opposite to the substrate 20, a transparent substrate or a nontransparent substrate can be used as the substrate 20 constituting the base substrate 200. As the nontransparent substrate, a substrate in which an insulation treatment, such as surface oxidation, is performed on ceramic, such as alumina or the like, a metal sheet, such as stainless steel or the like, thermosetting resin or thermoplastic resin, or a film thereof (plastic film) is exemplified.

Further, in case of a so-called bottom-emission type organic EL device, since light is emitted from the substrate 20, a transparent or translucent substrate is used as the substrate 20. For example, glass, quartz, resin (plastic or a plastic film), or the like is exemplified, and, in particular, a glass substrate is suitably used. Moreover, in the present embodiment, the top-emission type organic EL device in which light is emitted from the gas barrier layer 30 is prepared, and thus the above-described nontransparent substrate, for example, a nontransparent plastic film or the like, is used as the substrate 20.

Further, on the substrate 20, a circuit portion 11 having the driving TFTs 123 for driving the pixel electrodes 23 and the like is formed, and the plurality of light-emitting elements are formed thereon. As shown in FIG. 7, each light-emitting element has the configuration in which the pixel electrode 23 serving as an anode, a hole-transporting layer 70 for injecting/transporting holes from the pixel electrode 23, the organic light-emitting layer 60 having an organic EL material as one of electro-optical materials, and a cathode 50 are sequentially formed.

Based on such a configuration, the respective light-emitting elements emit light when the holes injected from the hole-transporting layer 70 and electrons from the cathode 50 are coupled in the organic light-emitting layer 60.

Moreover, in the present embodiment, the hole-transporting layer 70 has a function of attracting a light-emission function of the organic light-emitting layer 60, and thus the hole-transporting layer 70 serves as a part of the light-emitting functional layer 110.

Since the top-emission type organic EL device is used in the present embodiment, the pixel electrode 23 does not need to be made transparent, and thus is made of a suitable conductive material.

As a material for forming the hole-transporting layer 70, for example, polythiophene derivative, polypyrrole derivative, a doping body thereof, or the like is used. Specifically, the hole-transporting layer 70 can be formed by use of a dispersing solution of 3,4-polyethylenedioxythiophene/polystyrenesulfonic acid (PEDOT/PSS), that is, a dispersing solution in which 3,4-polyethylenedioxythiophene is dispersed into polystyrenesulfonic acid as a dispersing solvent and this solution is dispersed into water.

As a material for forming the organic light-emitting layer 60, will-known light-emitting materials capable of emitting fluorescent light or phosphorescent light can be used. Specifically, for example, (poly) fluorine derivative (PF), (poly) paraphenylenevinylene derivative (PPV), polyphenylene derivative (PP), polyparaphenylene derivative (PPP), polyvinylcarbazole (PVK), polythiophene derivative, or a polysilane-based material, such as polymethylphenylsilane (PMPS), is suitably used.

Further, the organic light-emitting layer may also be made of materials in which, into these high-molecular-weight materials, high-molecular-weight materials, such as perylene-based pigment, coumarin-based pigment, or rhodamine-based pigment, or low-molecular-weight materials, such as rubrene, perylene, 9,10-diphenylanthracene, tetraphenylbutadiene, Nile red, coumarin 6, quinacridone, or the like, are doped.

Moreover, instead of the above-described high-molecular-weight materials, well-known low-molecular-weight materials can be used.

Further, if necessary, the electron-injecting layer may be formed on such an organic light-emitting layer 60. Here, the electron-injecting layer has a function of attracting the light-emission function of the organic light-emitting layer 60, and thus the electron-injecting layer serves as a part of the light-emitting functional layer 110.

Further, in the present embodiment, the hole-transporting layer 70 and the organic light-emitting layer 60 are arranged to be surrounded by a lyophilic property control layer 25 and an organic partition layer (partition) 221, which are formed in a lattice shape on the base substrate 200, as shown in FIGS. 3 to 7. Accordingly, the surrounded hole-transporting layer 70 and organic light-emitting layer 60 serves as element layers to constitute a single light-emitting element.

Moreover, in the organic partition layer 221, an angle θ of a wall surface of an opening 221a with respect to the surface of the base substrate 200 is in a range of 110° to 170° (see FIG. 7). With this angle, the organic light-emitting layer 60 can be easily disposed in the opening 221a at the time of the formation through a wet process.

As shown in FIGS. 3 to 7, the cathode 50 is formed to have an area wider than the total area of the actual display region 4 and the dummy region 5, and to cover them. The cathode 50 is formed on the base substrate 200 while covering the upper surfaces of the organic light-emitting layer 60 and the organic partition layer 221, and the wall surface forming lateral portions of the organic partition layer 221. Further, as shown in FIG. 4, the cathode 50 is connected to a wiring line for a cathode formed at an outer circumference of the base substrate 200 outside the organic partition layer 221. To the wiring line for a cathode, a flexible board is connected, and thus the cathode 50 is connected to a driving IC (driving circuit), which is not shown, on the flexible board via the wiring line for a cathode.

As a material for forming the cathode 50, since the top-emission type organic EL device is used in the present embodiment, a material exhibiting light transmittance needs to be used, and thus a transparent conductive material is used. As the transparent conductive material, ITO (Indium Tin Oxide) is suitably used, but, other than ITO, for example, indium zinc oxide (IZO) (Registered Trademark)-based amorphous transparent conductive film may be used. Moreover, in the present embodiment, it is assumed that ITO is used.

Further, the cathode 50 is made of a material having a large electron injection effect. For example, a metal, such as calcium, magnesium, sodium, lithium, or the like, or a metal compound thereof is used. As the metal compound, metal fluoride, such as calcium fluoride or the like, metal oxide, such as lithium oxide or the like, or an organic metal complex, such as acetyl acetonato calcium or the like. Further, in addition to these materials, a laminate of a metal layer of aluminum, gold, silver, copper, or the like, and a metal oxide conductive layer of ITO, tin oxide, or the like, may be used. Moreover, in the present embodiment, it is assumed that a laminate of lithium fluoride, a magnesium-silver alloy, and ITO is used, which is adjusted to have a film thickness exhibiting light transmittance.

On the cathode 50, a cathode protecting layer (electrode protecting layer) 55 is formed. The cathode protecting layer 55 prevents the cathode from being damaged when a screen mesh used for forming a buffering layer comes into contact therewith, and covers the surface of the cathode so as to increase surface energy of the outermost surface. That is, the cathode layer 55 is provided so as to enhance planarization property or defoaming property when the material for a buffering layer is coated and formed, and adherence, and to lower the angle of a side end portion. The cathode protecting layer 55 is a layer which mainly contains an inorganic oxide having transparency and has high insulation property. The cathode protecting layer 55 is preferably made of a material, which increases surface energy by itself or is subjected to an oxygen plasma treatment after the formation so as to increase surface energy of the outermost surface. Since the cathode protecting layer 55 is formed on the surface, in which uneven portions caused by the organic partition layer 221 exist, the cathode protecting layer 55 preferably has the film thickness of 10 to 200 nm, which is thinner than that of a gas barrier layer, so as not to be destroyed or removed due to expansion and contraction of the organic partition layer 221 caused by heat and so as not to accelerate the removal of the organic light-emitting layer 60 and the cathode 50 due to compression (tensile) stress of the film itself. As a material for the cathode protecting layer 55, inorganic oxide, for example, silicon oxide, such as silicon oxide, silicon oxynitride, or the like, metal oxide, such as titanium oxide, or the like, is exemplified.

Moreover, the cathode protecting layer 55 is formed to extend an insulating layer 284 of the outer circumference of the base substrate 200.

On the cathode protecting layer 55, a buffering layer is provided to be wider than the organic partition layer 221 and to cover the cathode 50. The buffering layer 210 is disposed to bury an uneven portion of the cathode 50, which is influenced by the shape of the organic partition layer 221, and has a substantially planarized top surface. Such a buffering layer 210 is formed by coating and thermally curing, as described below.

Such a buffering layer 210 has a function of relieving stress caused by a curve or volume expansion from the base substrate 200 and a function of preventing the removal from the unstable organic partition layer 221 or cathode 50 which tends to thermally expand/contract. Further, since the top surface of the buffering layer 210 is substantially planarized, the gas barrier layer 30, which is formed on the buffering layer 210 and is made of a cured film, is also planarized. Therefore, a place, onto which stress is concentrated, is eliminated, and thus cracks, removal, or loss of the gas barrier layer 30 is prevented from causing.

Next, a specified material of the buffering layer 210 will be described.

Since the buffering layer 210 is coated and formed under a low-pressure vacuum, a main component of a raw material before curing should be an organic compound material, which has excellent fluidity with no solvent component and becomes a raw material of a high-molecular-weight skeleton, preferably, epoxy monomer/oligomer having an epoxy group and a molecular weight of 3000 or less (definition of monomer: molecular weight of 1000 or less and definition of oligomer: molecular weight of 1000 to 3000). For example, bisphenol A-type epoxy oligomer or bisphenol F-type epoxy oligomer, phenol novolac-type epoxy oligomer, polyethylene glycol diglycidyl ether, alkyl glycidyl ether, 3,4-epoxy cyclohexenyl methyl-3',4'-epoxy cyclohexene carboxylate, $\epsilon$-caprolactone modification 3,4-epoxy cyclohexyl methyl 3',4'-epoxy cyclohexene carboxylate, or the like is exemplified. These are used in a single or in combination.

Further, as a curing agent, which reacts with epoxy monomer/oligomer, a material, which has excellent electrical insulation or adhesion and high hardness, and forms a cured film exhibiting excellent heat resistance through toughening, can be used. In particular, an addition polymerization type having excellent transparency and small variation in hardness is used. For example, an acid anhydride-based curing agent, such as 3-methyl-1,2,3,6-tetrahydro phthalic anhydride, methyl-3,6-endomethylene-1,2,3,6-tetrahydro phthalic anhydride, 1,2,4,5-benzene tetracarboxylic dianhydride, 3,3', 4,4'-benzophenone tetracarboxylic dianhydride, or the like, is preferably used. Further, by adding alcohols, such as 1,6-hexanediol or the like, which has a large molecular weight and is difficult to volatilize, as a reaction accelerator for accelerating a reaction (decyclization) of acid anhydride, curing is easily performed at low temperature. Curing is performed by heat in a range of 60 to 100° C., the cured film is polymerized to have ester binding.

Further, by adding aliphatic amine, such as diethylene triamine, triethylene tetramine, or the like, aromatic amine, such as diaminodiphenylmethane, diaminodiphenyl sulfone, or the like, photopolymerization initiator, or the like as an auxiliary curing agent, curing is performed at lower temperature.

In addition, a silane coupling agent for enhancing adherence to the cathode 50 or the gas barrier layer 30, a moisture supply agent, such as an isocyanate compound or the like, a planarizing agent for lowering surface energy of the coating material to increase wettability, such as a fluorine compound, or the like, and an additive, such as fine particles or the like, for preventing shrinkage at the time of curing may be added with the trace amount of 1 molecular percent or less.

The material for forming such a buffering layer 210 preferably has viscosity in a range of 500 to 20000 mPa·s at room temperature (25° C.), and, in the present embodiment, the material for forming the buffering layer 210 has viscosity of 3000 mPa·s.

Here, the structure of a side end portion of the buffering layer 210 will be described with reference to FIG. 5.

FIG. 5 shows the side end portion of the buffering layer 210 shown in FIG. 3 in a magnified scale. As shown in FIG. 5, the buffering layer 210 is formed on the cathode protecting layer 55, and comes into contact with the surface of the cathode protecting layer at a contact angle of $\alpha$ in the side end portion. Here, the contact angle $\alpha$ is equal to or less than 30°, and, more preferably, in a range of 5° to 20°. The contact angle $\alpha$ is accomplished with a softening process by a heating process after coating or the viscosity adjustment of the material for the buffering layer itself, the addition of the planarizing agent or the like, and the increase of surface energy of the cathode protecting layer. When the buffering layer 210 is formed in such a manner, the organic adhering layer 220 or the gas barrier layer 30, which is formed above the buffering layer 210, is formed according to the shape of the buffering layer 210. Therefore, even when the volume of the organic partition layer 221 is changed by thermal expansion and contraction, stress acting on the gas barrier layer of the side end portion is dispersed, destruction can be prevented. Further, when the contact angle $\alpha$ is steep, for example, about 80°, the film thickness of the gas barrier layer 30 formed in the edge thereof is thinner than those of other portions, but, since the contact angle $\alpha$ is about 5° to 20°, the gas barrier layer 30 is formed on the buffering layer 210 to have a uniform thickness.

In addition, on the buffering layer 210, the organic adhering layer 220 is formed.

The organic adhering layer 220 is a thin film which has high surface energy (polarity) and which is formed by performing an oxidation treatment on the surface of the buffering layer 210. As the composition of the organic adhering layer 220, the content of oxygen atoms is more than that of the buffering layer 210. Further, the film thickness of the organic adhering layer 220 is preferably thin, for example, may be 10 nm or less. The thin film is preferably formed by performing an oxygen plasma treatment on the outermost surface of the buffering layer 210 under a low-pressure atmosphere, just before the gas barrier layer is formed. By forming such an organic adhering layer 220, the surface of the buffering layer 210 is cleaned, and adherence of the interface of the buffering layer 210 and the gas barrier layer 30 is enhanced.

In addition, on the organic adhering layer 220, the gas barrier layer 30 is formed.

The gas barrier layer 30 is formed on the organic adhering layer 220, without coming into contact with the insulating layer 284. The gas barrier layer 30 prevents moisture or oxygen from penetrating the buffering layer 210 and the cathode 50 or the organic light-emitting layer 60 inside the buffering layer 210. Accordingly, oxygen or moisture is prevented from penetrating into the cathode 50 or the organic light-emitting layer 60, and thus deterioration of light-emission or the like is suppressed.

Further, the gas barrier layer 30 is made of, for example, an inorganic compound having excellent water resistance and heat resistance, and thus the gas barrier layer 30 is made of silicon compound, that is, silicon nitride, silicon oxynitride, silicon oxide, or the like. Therefore, the gas barrier layer 30 is formed as a transparent thin film. In addition, the gas barrier layer 30 needs to be formed in a fine film with no defect so as to block gas, such as vapor or the like, and thus the gas barrier layer 30 is preferably formed by use of a plasma CVD method, an ECR plasma sputtering method, or an ion plating method, which is a high-density plasma film-deposition method capable of the fine film at a low temperature. As such, since the gas barrier layer 30 is made of the silicon compound, the gas barrier layer 30 becomes a fine layer having excellent water resistance and heat resistance with no defect, and thus barrier property against oxygen or moisture is made favorable. Further, the gas barrier layer 30 preferably has a film quality of a film density of 2.3 to 3.0 g/cm$^3$.

Moreover, as the gas barrier layer 30, a material, other than the silicon compound, may be used, and, for example, alumina, tantalum oxide, titanium oxide, and other ceramics may be used.

Further, the film thickness of the gas barrier layer 30 is set in a range of 300 to 700 nm. In the present embodiment, in particular, the film thickness is set to 400 nm. When the film thickness of the gas barrier layer is smaller than 300 nm, sufficient gas barrier property cannot be obtained, and, when the film thickness is larger than 700 nm, internal stress is accumulated in the gas barrier layer 30, which causes cracks. Therefore, by defining the film thickness in the above-described range, the gas barrier layer realizing gas barrier property and crack resistance is obtained. Further, by defining the film thickness in a range of 400 to 600 nm, gas barrier property and crack resistance can be enhanced.

In addition, on the gas barrier layer 30, a protective layer 204 is formed so as to cover the gas barrier layer 30. The protective layer 204 protects the buffering layer 210 or the gas barrier layer 30. The protective layer 204 has an adhesive layer 205 and a surface protecting substrate (protective substrate) 206, which are formed on the gas barrier layer 30.

The adhesive layer 205 is made of an adhesive made of a material, which is more flexible and has a lower glass transition point than the surface protecting substrate 206. Further, the adhesive layer 205 fixes the surface protecting substrate 206 onto the gas barrier layer 30. As a material for the adhesive layer 205, a transparent resin material, such as epoxy resin, acryl resin, urethane resin, silicon resin, polyolefin resin, or the like, is preferably used, and, in particular, a transparent and cheap acryl resin is suitably used. Further, the adhesive layer 205 may be formed on the surface protecting substrate 206 in advance or may be pressed and adhered onto the gas barrier layer 30. Further, the adhesive layer 205 is preferably made of the transparent resin material. Further, the adhesive layer 205 may be made of a material, in which two liquids are mixed, that is, the curing agent for curing at low temperature is added.

Moreover, in such an adhesive layer 205, a silane coupling agent or alkoxysilane is preferably added. If doing so, adherence of the resultant adhesive layer 205 and the gas barrier layer 30 becomes more favorable, and thus a buffing function against mechanical impacts is increased. Further, in particular, when the gas barrier layer 30 is made of the silicon compound or the like, adherence to the gas barrier layer 30 can be enhanced by use of silane coupling agent or alkoxysilane, and thus gas barrier property of the gas barrier layer 30 can be increased.

The surface protecting substrate 206 is provided on the adhesive layer 205 to constitute the surface of the protective layer 204. The surface protecting substrate 206 is a layer having at least one function of the prevention of an external damage, pressure resistance or wear resistance, external light anti-reflection property, ultraviolet blocking property, and the like. As a material for the surface protecting substrate 206, glass or transparent plastic (polyethylene terephthalate, polyethylent naphthalate, acryl resin, polycarbonate, polyolefin, polyimide, or the like) is used. Further, in the surface protecting substrate 206, an ultraviolet blocking/absorbing layer, a light anti-reflection layer, a radiating layer, or an optical structure, such as a lens, a mirror, or the like, is used. Further, in addition to these materials, a DLC (diamond like carbon) layer may be used.

Further, in the organic EL device 1 according to the present embodiment, when the organic EL device is a top-emission type, it is necessary to make the surface protecting substrate 206 and the adhesive layer 205 have transmittance, but in the case of a bottom-emission type, it is not necessary to that.

Moreover, in the organic EL device 1 of the present embodiment, the total thickness of the gas barrier layer 30 and the buffering layer 210 is made thin, as compared with the related art. Specifically, as shown in FIG. 5, the gap T from the surface of the insulating layer 284 to the surface protecting substrate 206 can be set to about 15 μm. Therefore, in the organic EL device 1 of the present embodiment, a thin-film sealing structure can be realized, without forming a thick film.

Next, the planar structure of the organic EL device 1 will be described with reference to FIG. 6.

FIG. 6 is an expanded plan view showing essential parts of FIG. 2, which shows only the cathode 50, the buffering layer 210, and the gas barrier layer 30. Moreover, it is assumed that other parts of the organic EL device 1 are formed in the same manner as shown in FIGS. 1 to 5 and 7.

As shown in FIG. 6, the organic EL device 1 has a cathode formation region 50AR for the cathode 50, a buffering layer formation region (the planar pattern of the buffering layer) 210AR for the buffering layer 210, and a gas barrier layer formation region 30AR for the gas barrier layer 30, which are sequentially formed on the substrate 20 to overlap each other. In addition, the area of the buffering layer formation region 210AR is larger than the area of the cathode formation region 50AR, and the gas barrier layer formation region 30AR is larger than the area of the buffering layer formation region 210AR (50AR<210AR<30AR). In such a manner, a cathode marginal portion 50E is covered with the buffering layer 210, and a buffering layer marginal portion (marginal portion) 210E is covered with the gas barrier layer 30. Therefore, a gas barrier layer marginal portion 30E is disposed at the outermost circumference among the marginal portions 50E, 210E, and 30E.

Here, in a vertical direction (hereinafter, referred to as Y direction) and a horizontal direction (hereinafter, referred to X direction) of FIG. 6, the buffering layer marginal portion 210E is formed in a wavy shape in the vertical and horizontal directions. Further, the cathode marginal portion 50E and the gas barrier marginal portion 30E are formed in linear shapes.

Between the marginal portions 50E and 30E, the buffering layer marginal portion 210E is formed to have a wave pitch p of about 0.01 to 0.2 mm and a wave width t1 of about 0.01 to 0.1 mm. Moreover, the wave width t1 is not necessarily uniform, and is sufficient to fall within this range.

Further, when the position of the buffering layer marginal portion 210E closest to the gas barrier layer marginal portion 30E is W2, the width t2 of W2 and the gas barrier layer marginal portion 30E is about 0.2 to 2 mm.

Further, when the position of the buffering layer marginal portion 210E closest to the cathode marginal portion 50E is W3, the width t3 of W3 and the cathode marginal portion 50E is about 0.1 to 1 mm.

In this way, the sum of the minimum values of the wave widths t1, t2, and t3 is smaller than 0.4 mm. Therefore, a sealing structure to the cathode 50 by the buffering layer 210 and the gas barrier layer 30 can be formed to have a sealing width of 0.4 mm or less.

Next, the circuit portion 11, which is formed below the above-described light-emitting element, will be described with reference to FIG. 7. The circuit portion 11 is formed on the substrate 20 to constitute the base substrate 200. That is, a base protective film 281 mainly made of $SiO_2$ is formed on the surface of the substrate 20 as a base, and a silicon layer 241 is formed thereon. On the surface of the silicon layer 241, a gate insulating layer 282 mainly made of $SiO_2$ and/or SiN is formed.

Further, in the silicon layer 241, a region overlapping a gate electrode 242 with the gate insulating layer 282 interposed therebetween becomes a channel region 241a. Moreover, the gate electrode 242 is a part of the scanning line 101 (not shown). On the other hand, on the surface of the gate insulating layer 282, which covers the silicon layer 241 and on which the gate electrode 242 is formed, a first interlayer insulating layer 283 mainly made of $SiO_2$ is formed.

Further, in the silicon layer 241, on the source side of the channel region 241a, a lightly-doped source region 241b and a heavily-doped source region 241S are provided. On the other hand, on the drain side of the channel region 241a, a lightly-doped drain region 241c and a heavily-doped region 241D are provided, such that a so-called LDD (Light Doped Drain) structure is formed. Among these, the heavily source region 241S is connected to a source electrode 243 via a contact hole 243a, which opens over the gate insulating layer 282 and the first interlayer insulating layer 283. The source electrode 243 is constituted as a part of the above-described power line 103 (see FIG. 1), which extends in the vertical direction to the position of the source electrode 243 in FIG. 7. On the other hand, the heavily-doped drain region 241D is connected to a drain electrode 244, which is formed in the same layer as the source electrode 243, via a contact hole 244a, which opens over the gate insulating layer 282 and the first interlayer insulating layer 283.

The first interlayer insulating layer 283, on which the source electrode 243 and the drain electrode 244 are formed, is covered with a second interlayer insulating layer 284, which is mainly made of, for example, acryl-based resin components. The second interlayer insulating layer 284 may be made of a material, other than the acryl-based insulating film, for example, SiN, $SiO_2$, of the like. Then, the pixel electrode 23 made of ITO is formed on the surface of the second interlayer insulating layer 284 and is connected to the drain electrode 244 via a contact hole 23a, which is provided in the second interlayer insulating layer 284. That is, the pixel electrode 23 is connected to the heavily-doped drain region 241D of the silicon layer 241 via the drain electrode 244.

Moreover, TFTs (TFTs for driving circuits) included in the scanning line driving circuit 80 and the test circuit 90 have the same structure as that of the driving TFT 123, excluding that an N-channel or P-channel TFT constituting an inverter included in the shift register among the driving circuits is not connected to the pixel electrode 23.

On the surface of the second interlayer insulating layer 284, on which the pixel electrode 23 is formed, the lyophilic property control layer 25 and the organic partition layer 221 described above are formed. The lyophilic property control layer 25 is mainly made of, for example, a lyophilic material, such as $SiO_2$ or the like, and the organic partition layer 221 is made of acryl, polyimide, or the like. Then, on the pixel electrode 23, the hole-transporting layer 70 and the organic light-emitting layer 60 are sequentially laminated in an opening 25a provided in the lyophilic property control layer 25 and an opening 221a surrounded by the organic partition layer 221. Moreover, in the present embodiment, 'lyophilic property' of the lyophilic property control layer 25 means that lyophilic property is higher than that of the material constituting the organic partition layer 221, such as acryl, polyimide, or the like.

The layers up to the second interlayer insulating layer 284 on the substrate 20 described above constitutes the circuit portion 11.

Here, when the organic EL device 1 of the present embodiment performs color display, the organic light-emitting layers 60 are formed such that light emitting wavelength bands correspond to three primary colors of light, respectively. For example, as the organic light-emitting layers 60, a red organic light-emitting layer 60R having the light emitting wavelength band corresponding to red, a green organic light-emitting layer 60 having the light emitting wavelength band corresponding to green, and a blue organic light-emitting layer 60 having the light emitting wavelength band corresponding to blue are formed light-emitting regions R, G, and B, respectively, and the light-emitting regions constitute one pixel to perform color display. Further, at boundaries of the light-emitting regions for the respective colors, a black matrix (BM) (not shown), which is obtained by film-depositing metal chromium through sputtering, is formed, for example, between the organic partition layer 221 and the lyophilic property control layer 25.

Manufacturing Method of Organic EL Device

Next, an example of a manufacturing method of the organic EL device 1 according to the present embodiment will be described with reference to FIGS. 8A to 11E. Cross-sectional views shown in FIGS. 8A to 9C correspond to the cross-sectional view taken along the line III-III of FIG. 2. Cross-sectional views shown in FIGS. 10A to 11E illustrate processes for forming the buffering layer 210, the organic adhering layer 220, and the gas barrier layer 30 in detail.

Moreover, in the present embodiment, the organic EL device 1 is the top-emission type. Further, a process for forming the circuit portion 11 on the surface of the substrate 20 is the same as that in the related art, and thus the description thereof will be omitted.

Figure 8A:
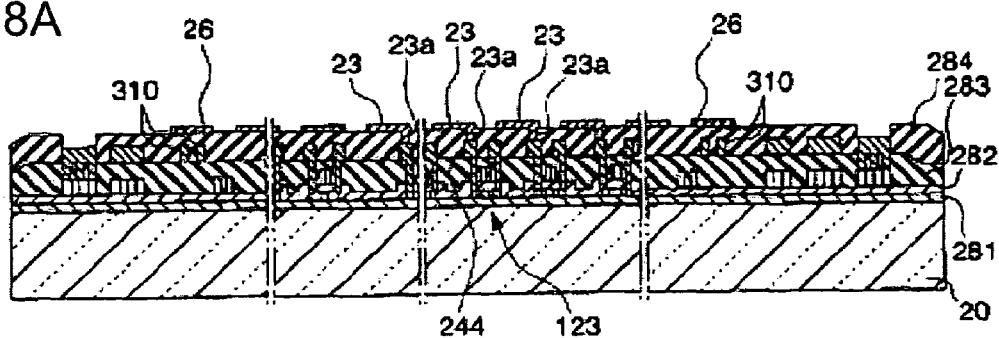
FIG. 8A is a diagram showing a manufacturing method of the organic EL device according to the first embodiment of the invention in a process sequence.

First, as shown in FIG. 8A, the transparent conductive film for the pixel electrode 23 is formed to cover the entire surface of the substrate 20 with the circuit portion 11 formed thereon, and is patterned. In this way, the pixel electrode 23 that is connected to the drain electrode 244 via the contact hole 23a of the second interlayer insulating layer 284 is formed. Further, simultaneously, a dummy pattern 26 made of the same material as that of the pixel electrode 23 is also formed.

Moreover, in FIGS. 3 and 4, the pixel electrode 23 and the dummy pattern 26 are collectively referred to as the pixel electrode 23. The dummy pattern 26 is constituted so as not to be connected to an underlying metal wiring line via the second interlayer insulating layer 284. That is, the dummy pattern 26 is arranged in an island shape, and has the same shape as the shape of the pixel electrode 23, which is formed in a light-emitting region. Of course, a structure different from the shape of the pixel electrode 23 formed in the light-emitting region may be used. Moreover, in this case, it is assumed that the dummy pattern 26 is disposed above at least the driving voltage connecting portion 310 (340).

Figure 8B:
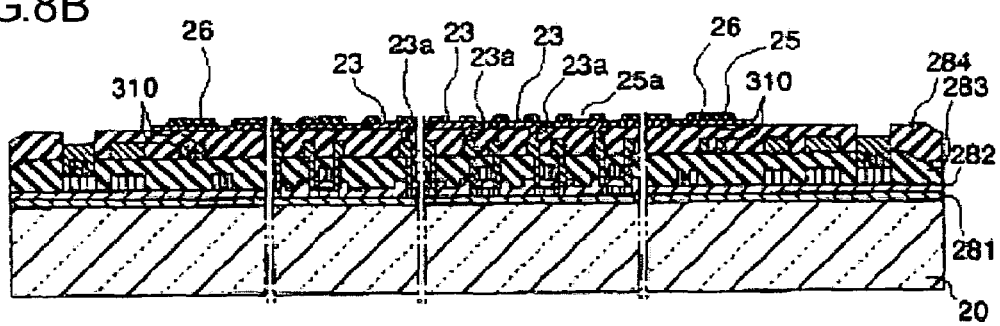
FIG. 8B is a diagram showing a manufacturing method of the organic EL device according to the first embodiment of the invention in a process sequence.

Next, as shown in FIG. 8B, on the pixel electrode 23, the dummy pattern 26, and the second interlayer insulating layer 284, the lyophilic property control layer 25 serving as an insulating layer is formed. Moreover, on the pixel electrode 23, the lyophilic property control layer 25 is formed such that its part opens, and holes can move from the pixel electrode 23 via the opening 25a (see FIG. 3). In contrast, on the dummy pattern 26 where the opening 25a is not provided, the insulating layer (the lyophilic property control layer) 25 serves as a hole-blocking layer, and thus the holes cannot move. Subsequently, in the lyophilic property control layer 25, the black matrix (BM) (not shown) is formed in a concave portion, which is formed between two different pixel electrodes 23. Specifically, with respect to the concave portion of the lyophilic property control layer 25, metal chromium is film-deposited by a sputtering method.

Figure 8C:
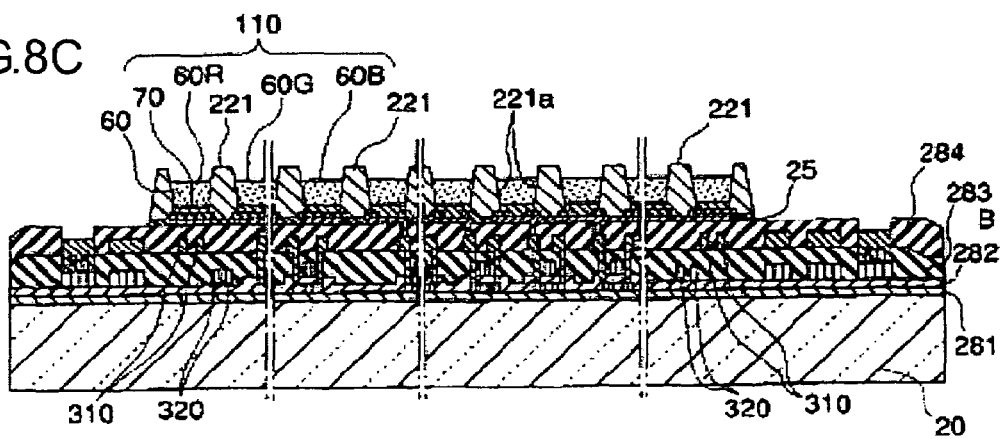
FIG. 8C is a diagram showing a manufacturing method of the organic EL device according to the first embodiment of the invention in a process sequence.

Then, as shown in FIG. 8C, the organic partition layer 221 is formed at a predetermined position of the lyophilic property control layer 25, specifically, to cover the above-described BM (a process for forming a partition). As a specified forming method of the organic partition layer, for example, a material, which is obtained by dissolving resist, such as acryl resin, polyimide resin, or the like, is coated by various coating methods, such as a spin coating method, a dip coating method, and the like, so as to form an organic substance layer. Moreover, a material constituting the organic substance layer is not particularly limited, as long as the material is not dissolved in an ink solvent described below and is easily patterned by etching.

In addition, the organic substance layer is patterned by use of a photolithography technology or an etching technology so as to form the opening 221a, such that the organic partition layer 221 having the wall surface in the opening 221a is formed. Here, the wall surface forming the opening 221a has the angle θ of 110° to 170° with respect to the surface of the base substrate 200.

Moreover, in this case, it is assumed that the organic partition layer 221 can be disposed above at least the driving control signal connecting portion 320.

Next, on the surface of the organic partition layer 221, a region exhibiting lyophilic property and a region exhibiting liquid-repellent property are formed. In the present embodiment, the respective regions are formed by a plasma treatment. Specifically, the plasma treatment has a preliminary heating process, an ink-lyophilic process for causing the top surface of the organic partition layer 221, the wall surface of the opening 221a, the electrode surface 23c of the pixel electrode 23, and the top surface of the lyophilic property control layer 25 to exhibit lyophilic property, an ink-repellent process for causing the top surface of the organic partition layer 211 and the wall surface of the opening 221a to exhibit liquid-repellent property, and a cooling process.

That is, the base substrate 200 is heated at a predetermined temperature, for example, 70 to 80° C., and then a plasma treatment ($O_2$ plasma treatment) with oxygen as a reactive gas is performed under an air atmosphere as the ink-lyophilic process. Next, a plasma treatment ($CF_4$ plasma treatment) with tetrafluoromethane as a reactive gas is performed under an air atmosphere as the ink-repellent process. Subsequently, the base substrate heated for the plasma treatment is cooled to room temperature, and lyophilic property and liquid-repellent property are given to predetermined places.

Moreover, in $CF_4$ plasma treatment, the electrode surface 23c of the pixel electrode 23 and the lyophilic property control layer 25 are slightly influenced, but, since ITO constituting the pixel electrode 23 and $SiO_2$, $TiO_2$, or the like constituting the lyophilic property control layer 25 lacks affinity to fluorine, a hydroxyl group given in the ink-lyophilic process is not substituted for a fluorine group, and lyophilic property is maintained.

Next, the formation of the hole-transporting layer 70 is performed by a hole-transporting layer forming process (a process for forming the light-emitting functional layer). In the hole-transporting-layer forming process, for example, a material for the hole-transporting layer is coated on the electrode surface 23c by a liquid droplet ejection method, such as an ink jet method or the like, or a spin coating method, and then a drying treatment and a heat treatment are performed, such that the hole-transporting layer 70 is formed on the electrode 23. In a case of selectively coating the material for the hold-transporting layer by the ink jet method, first, the material for the hole-transporting layer is filled into an ink jet head (not shown), and an ejection nozzle of the ink jet head is disposed to face the electrode surface 23c in the opening 25a formed in the lyophilic property control layer 25, liquid droplets are ejected onto the electrode surface 23c from the ejection nozzle, in which the liquid amount per one droplet is controlled, while reciprocally moving the ink jet head and the substrate 200. Next, the ejected liquid droplet is subjected to the drying treatment, a dispersing solvent or a solvent contained in the material for the hole-transporting layer is evaporated, such that the hole-transporting layer 70 is formed.

Here, the liquid droplets ejected from the ejection nozzle spread on the electrode surface 23c, which is subjected to the ink-lyophilic treatment, and is filled into the opening 25a of the lyophilic property control layer 25. On the other hand, on the top surface of the organic partition layer 221, which is subjected to the ink-repellent treatment, the liquid droplets are repelled and not adhered. Therefore, even when the liquid droplets are ejected onto the top surface of the organic partition layer 221 while being deviated from a predetermined ejection position, the top surface is not wetted with the liquid droplets, and the repelled liquid droplets are entered into the opening 25a of the lyophilic property control layer 25.

Moreover, in order to prevent the hole-transporting layer 70 and the organic light-emitting layer 60 from being oxidized, the processes subsequent to the forming process of the hole-transporting layer 70 are preferably performed under an inert gas atmosphere, such as nitrogen atmosphere, argon atmosphere, or the like.

Next, the formation of the organic light-emitting layer 60 is performed by a light-emitting layer forming process (a process for forming the light-emitting functional layer 110). In the light-emitting layer forming process, a material for forming the light-emitting layer is ejected onto the hole-transporting layer 70, for example, by an ink jet method, and then a drying treatment and a heat treatment are performed, such that the organic light-emitting layer 60 is formed in the opening 221a formed in the organic partition layer 221. In the light-emitting layer forming process, in order to prevent the hole-transporting layer 70 from being dissolved again, a non-polar solvent, which does not dissolve the hole-transporting layer 70, is used as a solvent used in the material for forming the light-emitting layer.

Moreover, in the light-emitting layer forming process, for example, the material for forming the blue (B) light-emitting layer is selectively coated on the blue light-emitting region by the ink jet method and dried. Similarly, for green (G) and red (R), the materials are selectively on the light-emitting regions, correspondingly, and dried.

Further, if necessary, the electron-injecting layer may be formed on the organic light-emitting layer 60, as described above.

Next, as shown in FIG. 9A, the formation of the cathode 50 is performed by a cathode layer forming process (a process for forming a second electrode). In the cathode layer forming process, ITO is film-deposited by a physical film-deposition method, such as the ion plating method or the like, such that the cathode 50 is formed. At this time, the cathode 50 is formed to cover wall surfaces forming an outer portion of the organic partition layer 221, as well as the organic light-emitting layer 60 and the top surface of the organic partition layer 221.

Next, as shown in FIGS. 9B and 9C, the cathode protecting layer 55, the buffering layer 210, the organic adhering layer 220, and the gas barrier layer 30 are sequentially formed.

Here, the forming method of the buffering layer 210, the organic adhering layer 220, and the gas barrier layer 30 will be described in detail with reference to FIGS. 10A to 11E.

Moreover, in FIGS. 10A to 11E, it is assumed that the circuit portion 11, the light-emitting functional layer 110, and the cathode 50 are formed on the substrate 20.

Figure 10A:
FIG. 10A is a diagram illustrating a method of forming a buffering layer, an organic adhering layer, and a gas barrier layer.

First, as shown in FIG. 10A, the cathode protecting layer 55 is formed on the cathode 50. As a forming method of the cathode protecting layer 55, for example, a high-density plasma film-deposition method, such as a plasma CVD method, an ECR sputtering method, an ion plating method, or the like is used. Further, the cathode protecting layer 55 is formed over the insulating layer 284 at the outer circumference of the base substrate 200 to completely cover the organic partition layer 221 and the cathode 50. The cathode protecting layer 55 is formed under a vacuum atmosphere, and the pressure is set in a range of about 0.1 to 10 Pa. Further, the outermost surface of the cathode protecting layer 55 is subjected to an oxygen plasma treatment in order to increase surface energy, and thereafter planarization property of the buffering layer and the low angle of the side end portion are easily realized.

Since the cathode 50 and the cathode protecting layer 55 are formed in such a manner, the structure of a cross-section shown in FIG. 9A is formed.

Figure 10B:
FIG. 10B is a diagram illustrating a method of forming a buffering layer, an organic adhering layer, and a gas barrier layer.

Next, as shown in FIG. 10B, the substrate 20 is turned over, and then, as shown in FIGS. 10C to 10E, 11A, and 11B, a screen printing method (coating process) under a vacuum atmosphere is performed so as to form the buffering layer 210 (a process for forming the buffering layer).

As a material for coating the buffering layer 210, a coating material, which is obtained by mixing the curing agent and the reaction accelerator into the epoxy monomer/oligomer, is used. These materials are mixed and used before coating, and, after mixing, the coating material has viscosity in a range of 500 to 20000 mPa·s at room temperature (25° C.). If viscosity is lower than 500 mPa·s, liquid dripping from a screen mesh M or push to an emulsion layer Ma occurs, and thus film thickness stability or patterning property deteriorates. Further, when viscosity is higher than 20000 mPa·s, since planarization property deteriorates, a mesh trace remains, and bubbles, which are exploded when the mesh is separated, are grown largely. Accordingly, a crater-shaped coating exit tends to occur, and the bubbles tend to remain even after a defoaming process.

In addition, preferably, viscosity of the coating material is in a range of 1000 to 10000 mPa·s among the above-described range of 500 to 20000 mPa·s. When viscosity is lower than 10000 mPa·s, the bubbles can be further suppressed from remaining. Further, when viscosity is higher than 1000 mPa·s, the bubbles are difficult to explode at the time of a screen printing process, and then a crater is difficult to occur. Therefore, a uniform film can be obtained. Further, as described below, dark spots can be reliably suppressed from causing. Accordingly, by setting the room-temperature viscosity of the coating material in such a manner, the shape of the buffering layer can be held, and planarization of the surface, the infinitesimal bubbles, and the low-angle side end portion can be realized. As a result, the dark spots can be suppressed from causing.

Further, the film thickness of the buffering layer 210 needs to be made thicker than the height of the organic partition layer 221, such that planarization and relief of stress caused by unevenness can be realized. For example, the film thickness of the buffering layer 210 is preferably in a range of 3 to 10 μm. The controls for viscosity and film thickness influence on the formation of the contact angle α and are important to set the contact angle α to 30° or less. Preferably, stress should not exist, but slight tensile stress may occur. The buffering layer 210 is preferably a porous film having relatively low density in order to allow stress to be extremely small, and the film density is suitably in a range of 0.8 to 1.8 g/cm³.

Next, the screen printing method will be described.

The screen printing method is a method in which coating and forming can be performed under a low-pressure vacuum atmosphere, and thus a coating liquid having relatively medium to high viscosity is prepared. In particular, the screen printing method facilitates the coating control with the high-pressure movement of a squeegee (coating unit) S and have excellent film-thickness uniformity and patterning property by use of the screen mesh (mask) M.

Figure 10C:
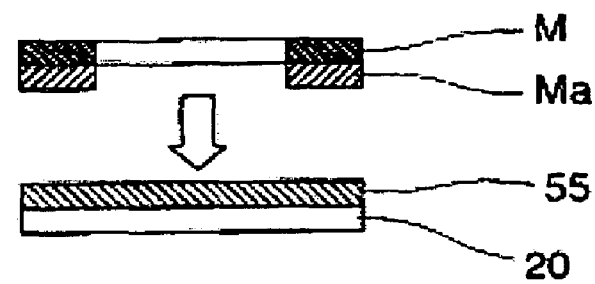
FIG. 10C is a diagram illustrating a method of forming a buffering layer, an organic adhering layer, and a gas barrier layer.

First, as shown in FIG. 10C, the screen mesh M is disposed on the cathode protecting layer 55. Here, in a non-coating portion of the screen mesh M, a liquid-repellent emulsion layer Ma is formed to cover the non-coating portion.

Further, the planar shape of the screen mesh M is formed according to a mold for forming the buffering layer marginal portion 210E of FIG. 6 in the wavy shape.

Figure 10D:
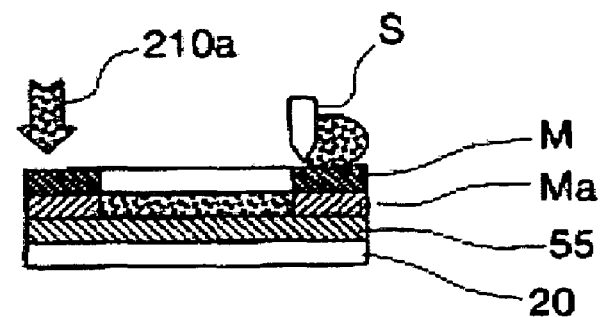
FIG. 10D is a diagram illustrating a method of forming a buffering layer, an organic adhering layer, and a gas barrier layer.

Next, while maintaining the low-pressure vacuum atmosphere in a range of 10 to 1000 Pa, as shown in FIG. 10D, the screen mesh M is disposed on the substrate 20 so as not to come into contact therewith. Subsequently, the coating material 210a of buffering layer 210 before curing is coated (dropped) on an end of the screen mesh M (on the emulsion layer Ma) with a required amount by a dispenser nozzle or the like (a process for dropping the coating material on the substrate with the mask interposed therebetween).

Next, the substrate is allowed to come into contact with the screen mesh, and is moved toward the other end of the screen mesh M while pressing the coating material 210a onto the substrate 20 with the squeegee S (reciprocal movement of the substrate and the coating unit). In this way, the coating material is instantaneously transferred on the cathode protecting layer 55 according to the pattern of the screen mesh M, such that a coated film 210b is coated and formed (a process for forming the coated film). Such a screen printing method is performed under the vacuum atmosphere. Further, even after the cathode protecting layer 55 is formed, the vacuum atmosphere is maintained, without returning to an air-pressure atmosphere.

Figure 10E:
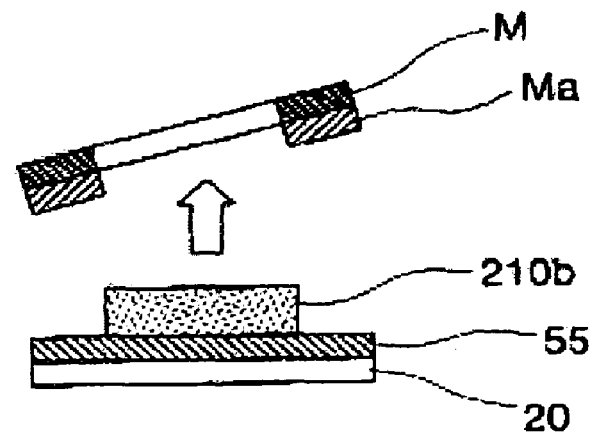
FIG. 10E is a diagram illustrating a method of forming a buffering layer, an organic adhering layer, and a gas barrier layer.

Next, as shown in FIG. 10E, the screen mesh M is removed from the coated film 210b on the substrate 20 (a process for removing the mask from the coated film). Here, when the screen mesh M is removed from the coated film 210b, the screen mesh M is removed while being inclined with respect to the substrate 20. In such a manner, force acting on the substrate generated when the screen mesh is removed is dispersed on a line, and thus the electrode (cathode) having weak adhesion is suppressed from being removed, and a uniform coated film 210b is formed. In this way, the surface of the buffering layer 210 formed after a thermally curing process can be planarized.

Moreover, the screen mesh M may be a flexible plate body. In this case, in the vicinity of the interface of the contact surface where the screen mesh M comes into contact with the coated film 210b and the exposed surface of the coated film 210b, the screen mesh M can be removed while being curved.

Accordingly, while suppressing the removal angle of the screen mesh to be extremely small, the mask can be removed at a stable removal speed of the mask and the coated film.

As described above, by performing the treatments shown in FIGS. 10C to 10E, the coating process of the coating material of the buffering layer 210 ends.

Figure 11A:
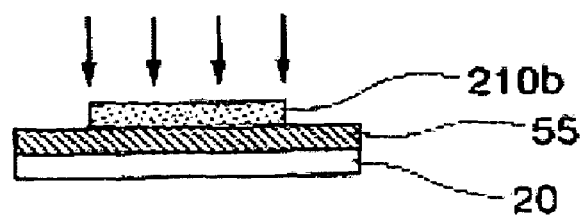
FIG. 11A is a diagram illustrating a method of forming a buffering layer, an organic adhering layer, and a gas barrier layer.

Next, as shown in FIG. 11A, a defoaming process is performed under a nitrogen gas atmosphere (inert gas atmosphere).

Here, the nitrogen gas atmosphere means an atmosphere which is formed by sealing a nitrogen gas in a closed space (for example, in a vacuum chamber), which is maintained in the vacuum atmosphere after the screen printing method is performed under the vacuum atmosphere. In this way, there is no case in which the coated film 210b meets moisture in air and absorbs moisture. Further, in the present process, the pressure of the nitrogen gas atmosphere is made higher than the pressure when the screen printing method is performed. In the present embodiment, the nitrogen gas atmosphere is set to have the pressure of 50000 to 110000 Pa. If doing so, a difference between the pressure in the bubble mixed into the coated film 210b at the time of the screen printing method and the pressure of the nitrogen gas atmosphere is generated, and the bubbles are made infinitesimal.

Figure 11B:
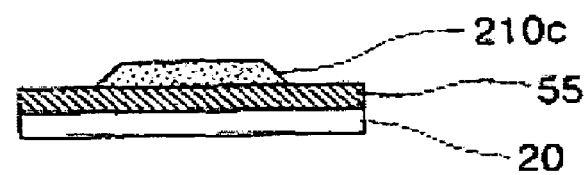
FIG. 11B is a diagram illustrating a method of forming a buffering layer, an organic adhering layer, and a gas barrier layer.

Next, as shown in FIG. 11B, a thermally curing process is performed.

The curing process is performed by executing a heat treatment of 60 to 100° C. on the coated film 210b under the same nitrogen gas (or dry air) atmosphere as that in the defoaming process. By executing the heat treatment, the epoxy monomer/oligomer material, the curing agent, and the reaction accelerator included in the coated film 210b before curing react with one another, epoxy monomer/oligomer is three-dimensionally crosslinked, and a polymer epoxy resin 210 is formed. Further, by executing the heat treatment, such a curing phenomenon occurs and the shape of the side end portion of the buffering layer 210 is melted (softened). With the heat treatment, the side end portion has the contact angle α (see FIG. 5).

Figure 11C:
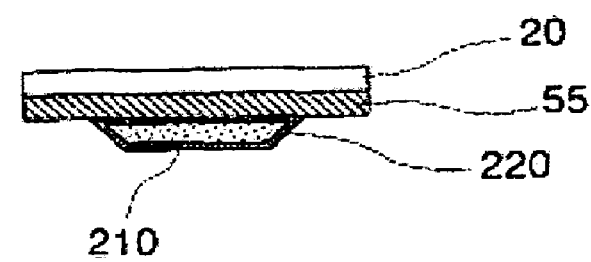
FIG. 11C is a diagram illustrating a method of forming a buffering layer, an organic adhering layer, and a gas barrier layer.

Next, as shown in FIG. 11C, the substrate 20 is turned over, and the organic adhering layer 220 is formed on the surface of the buffering layer 210. Specifically, the surface of the buffering layer 210 is exposed to the low-pressure plasma atmosphere, which is generated by mixing oxygen gas and inert gas, such as argon or the like, such that the surface of the buffering layer 210 is oxidized so as to form an oxidized layer.

As specified film-deposition conditions, a high-density plasma generating device is used, oxygen gas and argon gas are mixed at a ratio of 1:4, a degree of vacuum is 0.6 Pa, and exposure time is 30 seconds.

By forming such an oxidized layer, the surface of the buffering layer 210 is also cleaned.

By forming the buffering layer 210 and the organic adhering layer 220 in such a manner, the structure of a cross-section shown in FIG. 9B is formed.

Figure 11D:
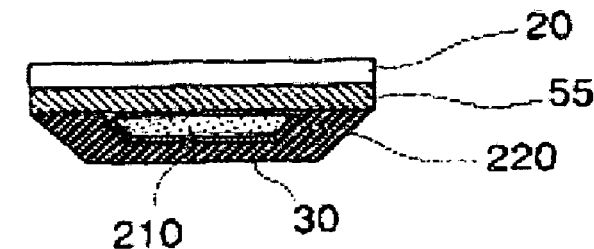
FIG. 11D is a diagram illustrating a method of forming a buffering layer, an organic adhering layer, and a gas barrier layer.

Next, as shown in FIG. 11D, the gas barrier layer 30 is formed on the surface of the organic adhering layer 220.

The film thickness of the gas barrier layer 30 is set in a range of 300 to 700 nm, as described above, and, in the present embodiment, the film thickness thereof is set to 400 nm. The gas barrier layer 30 is a transparent thin film made of a silicon compound, which is formed by a low-pressure and high-density plasma film deposition method or the like under an atmosphere of 0.1 to 10 Pa, such as silicon oxide, silicon oxynitride, or silicon nitride. Further, in order to allow adhesion for completely blocking moisture of small particles, the film density is preferably 2.3 g/cm$^3$ or more.

As a specified forming method of the gas barrier layer 30, preferably, a plasma CVD method, an ion plating method, or an ECR plasma sputtering method, which is a high-density plasma film-deposition method capable of forming a fine film at low temperature, is used. These methods are suitably selected in consideration of productivity, but, in view of uniformity of plasma in a large area, the ion plating method is preferably used.

Further, the forming process by the above-described high-density plasma film-deposition method is performed by repeating a film-deposition process in a film-deposition unit of 100 nm and a cooling process. For example, when the film thickness of 400 nm is collectively film-deposited, heat of radiation of plasma generating in a film-deposition device is added and accumulated, which causes deterioration of the light-emitting functional layer. In contrast, by repeating the film-deposition process and the cooling process, that is, by cooling after the film deposition of 100 nm, cooling after the film deposition of 100 nm again, and then performing the film-deposition of 100 nm again, the gas barrier layer 30 can be formed while suppressing deterioration of the light-emitting functional layer by heat.

As such, by forming the gas barrier layer 30 made of the silicon compound, the gas barrier layer 30 becomes a fine layer with no defect and has favorable barrier property against oxygen or moisture. Further, the gas barrier layer 30 preferably has the film quality of the film density of 2.3 to 3.0 g/cm$^3$. As above described, by forming the gas barrier layer 30, the structure of a cross-section shown in FIG. 9C is formed.

Figure 11E:
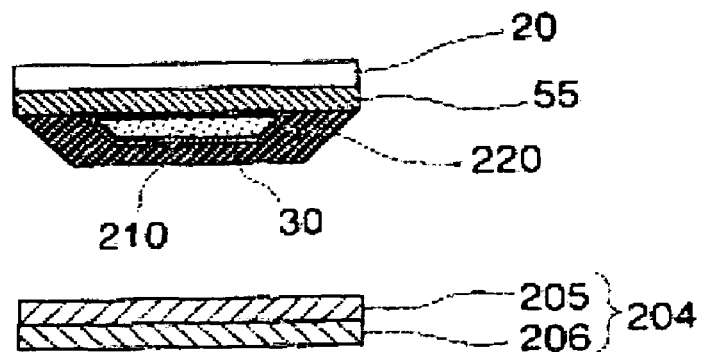
FIG. 11E is a diagram illustrating a method of forming a buffering layer, an organic adhering layer, and a gas barrier layer.

Next, as shown in FIG. 11E, the protective layer 204 having the adhesive layer 205 and the surface protecting substrate 206 is provided on the gas barrier layer 30. The adhesive layer 205 is uniformly coated on the gas barrier layer 30 by a dispenser, a spin coating method, or the like, and the surface protecting substrate 206 is adhered thereon.

As such, if the protective layer 204 is provided on the gas barrier layer 30, since the surface protecting substrate 206 has functions of pressure resistance or wear resistance, light anti-reflection property, gas barrier property, ultraviolet blocking property, and the like, the organic light-emitting layer 60, the cathode 50, and the gas barrier layer can be protected by the surface protecting substrate 206, such that long lifetime of the light-emitting element can be realized.

Further, since the adhesive layer 205 exhibits a buffing function against mechanical impacts, when mechanical impacts are applied from the outside, mechanical impacts on the gas barrier layer 30 or the light-emitting element therein are relieved, and thus functional deterioration of the light-emitting element due to the mechanical impacts can be prevented.

In this way, the organic EL device 1 is formed.

Moreover, in the above-described embodiment, the top-emission type organic EL device 1 is exemplified, but the invention is not limited thereto. For example, the invention can be applied to the bottom-emission type or a type in which light is emitted from both sides.

Further, when the bottom-emission type or the type in which light is emitted from both sides is used, it is preferable that the switching TFTs 112 or the driving TFTs 123 formed on the base substrate 200 are formed just below the lyophilic property control layer 25 and the organic partition layer 221, not just below the light-emitting elements, so as to increase an aperture ratio.

Further, in the invention, in the organic EL device 1, the first electrode functions as the anode and the second electrode functions as the cathode, but, to the contrary, the first electrode may function as the cathode and the second electrode may function as the anode. In this case, however, the formation positions of the organic light-emitting layer 60 and the hole-transporting layer 70 need to be changed.

As described above, in the organic EL device 1 of the present embodiment, the process for forming the buffering layer 210 includes the coating process of coating the coating material containing the epoxy-based monomer/oligomer material and the curing agent under the vacuum atmosphere, without using the solvent, and the thermally curing process of curing the coating material so as form the buffering layer 210. Therefore, the buffering layer 210 can be formed by curing the epoxy-based monomer/oligomer material and the curing agent through the thermally curing process.

Here, since the coating process is performed under the vacuum atmosphere, the coating process is performed under the atmosphere, in which moisture or oxygen is removed, and thus moisture or oxygen can be suppressed from penetrating into the buffering layer 210. Further, since the coating process is performed without using the solvent, there is no case in which the solvent remains in the buffering layer 210. Therefore, since moisture or oxygen almost never remains and solvent particles do not exist in the buffering layer 210, it is possible to suppress degradation of light-emitting properties, short light-emitting lifetime, and the occurrence of the non-light-emitting region caused by the penetration of moisture or oxygen into the organic light-emitting layer 60 of the cathode 50. In particular, the invention is preferably applied to an organic EL device having an organic light-emitting layer 60 made of a high-molecular-weight material. In an organic EL device having an organic light-emitting layer 60 made of a low-molecular-weight material, in general, the organic light-emitting layer 60 is made of an organic material having electron transporting property and having an LUMO level of 3.0 eV to 3.5 eV, such as tris(8-quinolinolato) aluminum, and the cathode is made of a material having work function of 3.5 eV, such as magnesium or the like. On the other hand, the LUMO level of the high-molecular-weight light-emitting material used in the organic EL device, which has the organic light-emitting layer 60 made of the high-molecular-weight material, is lower by 1.0 eV than that of the low-molecular-weight light-emitting material emitting the same color light component. Therefore, in case of the high-molecular-weight light-emitting material, as compared with the low-molecular-weight light-emitting material, a material having relatively low work function, that is, high reactivity, needs to be used as the cathode. By applying the invention, even when the cathode having high reactivity is used, the solvent particles do not react with the cathode, and thus reliability of the light-emitting element can be enhanced.

Further, in the thermally curing process, since the monomer/oligomer material is cured by the curing agent, the monomer or oligomer is crosslinked, and thus the buffering layer 210 made of a high-molecular-weight material (polymer) can be formed.

Further, in the thermally curing process, since the heat treatment is executed on the coated film 210b before curing, and thus the buffering layer can be formed by curing the coating material, and also the inclined portion can be formed in the side end portion of the buffering layer 210 by melting (softening) the peripheral portion of the buffering layer 210 with heat. Accordingly, the gas barrier layer 30 formed above the buffering layer 210 is formed soft according to the shape of the buffering layer 210, and thus gas barrier property can be enhanced.

Further, the total thickness of the gas barrier layer 30 and the buffering layer 210 laminated by such a manufacturing method can be made thin, as compared with the related art. Therefore, in the organic EL device of the invention, the thin-film sealing structure can be realized, without forming a thick film.

Further, in the present embodiment, the epoxy-based material is used as the monomer/oligomer material and the molecular weight thereof is 3000 or less. Accordingly, the epoxy-material can be cured by ester binding through the thermally curing process, thereby forming buffering layer 210.

Further, since the epoxy-based material is used in such a manner, a polymer film having high water resistance can be formed from monomer having low molecular weight through the low-temperature curing process. Therefore, it is not necessary to form the buffering layer by coating the liquid material, which is diluted with the organic solvent to reduce viscosity, unlike the related art, such that an influence by a residual solvent can be excluded. Further, as for the epoxy-based material, the monomer/oligomer material can be coated and formed while having low viscosity. On the other hand, the acryl-based material, which is used as the material for the buffering layer 210 in the related art, has, in a monomer state, noxiousness or dangerousness, high absorption property, and an excessive shrinkage when curing. Accordingly, a raw material of a polymer state needs to be provided, and desired viscosity is difficult to obtain, without using an organic solvent. In contrast, in the epoxy-based material, the monomer/oligomer material having low viscosity can be adjusted while suppressing the shrinkage of the film, and thus the film can be easily formed.

Further, as the curing agent, it is preferable to use an acid anhydride material, and curing at low temperature can be performed in combination with the reaction accelerator of alcohols. Further, if the epoxy-based monomer/oligomer is cured by using acid anhydride, ester binding is performed, and thus the buffering layer 210 made of the high-molecular-weight material having high surface energy and excellent adherence, heat resistance, and water resistance.

Further, since the coating process uses the screen printing method under the vacuum atmosphere, the coating material can be coated and formed on the cathode protecting layer 55 in a pattern with high precision by use of the screen mesh. Accordingly, even in a narrow frame structure having a narrow sealing width, damages of the organic light-emitting layer 60 and the cathode 50 due to the penetration of oxygen or moisture from sides can be suppressed.

Further, since the surface of the buffering layer 210 is planarized, the overlying gas barrier layer 30 has uniform film quality, such that the uniform gas barrier layer 30 can be formed with no defect.

Further, in the screen printing method, since the screen mesh M is removed from the coated film 210b while being inclined, the uniform coated film 210b can be formed, without damaging the cathode 50. Further, planarization can be performed on the surface of the buffering layer 210, which is formed after thermally curing.

Further, since the defoaming process, which is performed under the inert gas atmosphere at a pressure higher than that in the coating process, with the external pressure of the inner gas atmosphere, a pressure can be given to the buffering layer 210, without performing contact weighting. For this reason, the bubbles in the vacuum state can be made infinitesimal. Further, in the bubbles pressed and made infinitesimal in such a manner, gas almost never exists, and there is no case in which an influence is exerted on the organic light-emitting layer 60 or the cathode 50. Then, since the bubbles are made infinitesimal in the buffering layer 210, the surface of the buffering layer 210 has planarization property. Further, there is no case in which a crater-shaped coating-exit portion caused by the explosion of the bubbles is formed.

Further, the buffering layer 210 formed by the screen printing method has the marginal portion 210E in the wavy shape, and thus, the marginal length of the buffering layer formation region 210AR can be increased, as compared with the case of the linear shape. Accordingly, adherence to the overlying gas barrier layer 30 of the buffering layer 210 can be enhanced. Further, in the buffering layer marginal portion 210E, stress of the buffering layer 210 can be dispersed. Then, film strength of the buffering layer 210 can be enhanced and high reliability can be obtained. Such a wavy shape can be desirably defined according to the mask shape in the screen printing method, and thus the wavy shape can be easily formed, without increasing a process for forming the wavy shape.

Further, the room temperature viscosity of the coating material is in a range of 500 to 20000 mPa·s, and thus the screen printing method can be easily performed. Therefore, the shape of the buffering layer 210 can be easily held, and the surface of the buffering layer 210 can be easily planarized. In addition, the bubbles can be made infinitesimal.

Further, in particular, since the room temperature viscosity of the coating material is in a range of 1000 to 10000 mPa·s, the shape of the buffering layer can be held, and planarization of the surface, the infinitesimal bubbles, and the low-angle side end portion can be reliably realized. Further, the dark spots can be suppressed from causing. Here, since the film thickness of the buffering layer 210 is in a range of 3 to 10 μm, the same advantages are obtained.

Further, between the buffering layer 210 and the gas barrier layer 30, the organic adhering layer 220 having an oxygen atomic weight more than that of the buffering layer 210 and high surface energy, and thus the cleaning effect to the surface of the buffering layer 210 can be obtained and adherence between the buffering layer 210 and the gas barrier layer 30 can be enhanced. Therefore, the removal of the gas barrier layer 30 can be suppressed, and durability of the organic EL device 1 can be enhanced.

Further, since the angle of the side end portion of the buffering layer 210 is 30° or less, when the gas barrier layer 30 is formed above the buffering layer 210, the gas barrier layer 30 can be formed to have the uniform film thickness. Accordingly, gas barrier property to the buffering layer 210 can be reliably obtained.

The angle of the side end portion of 30° or less is performed by executing the heat treatment as the above-described curing process. In this way, the peripheral portion of the buffering layer 210 can be melted (softened) with heat, and thus the inclined portion of 30° or less can be formed in the side end portion of the buffering layer 210. Accordingly, since the gas barrier layer 30 formed above the buffering layer 210 is formed soft according to the shape of the buffering layer 210, gas barrier property of side surface can be enhanced, without being destroyed by the thermal expansion and contraction of the buffering layer.

Further, between the cathode 50 and the buffering layer 210, the cathode protecting layer 55 is formed, and thus, with the cathode protecting layer having high hardness and surface energy, the cathode 50 can be protected from the contact with the screen mesh in the process for the buffering layer to be subsequently formed, and wettability of the material can be enhanced. Therefore, planarization, the low contact angle of the side end portion, and adherence to the buffering layer can be enhanced.

Second Embodiment of Organic EL Device

Next, an organic EL device according to a second embodiment of the invention will be described.

In the present embodiment, the same parts as those in the first embodiment are represented by the same reference numerals, and the descriptions thereof will be omitted.

Figure 12:
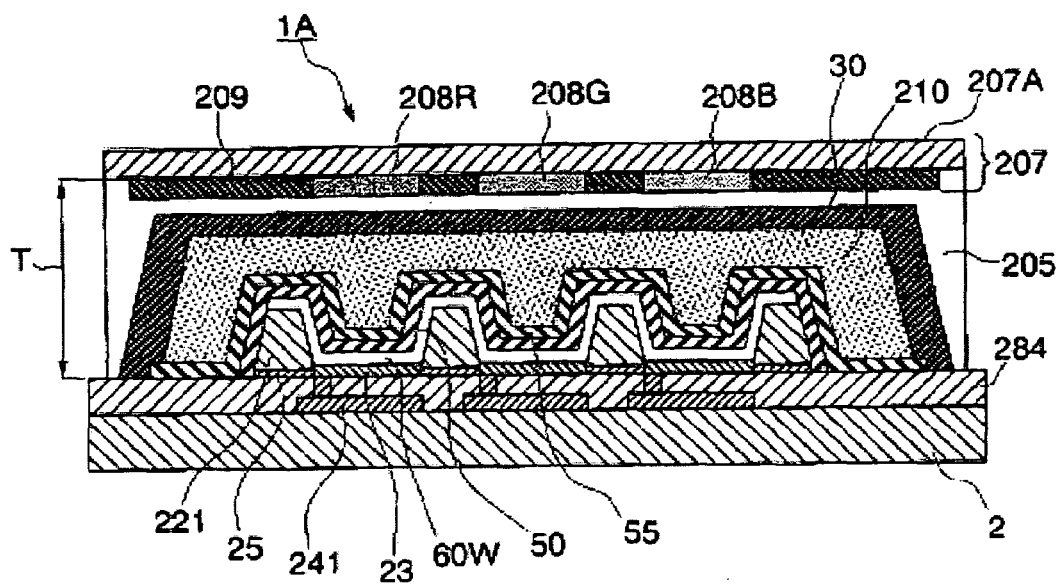
FIG. 12 is a cross-sectional view schematically showing a configuration of an organic EL device according to a second embodiment of the invention.

FIG. 2 is a cross-sectional view schematically showing a cross-sectional structure of the organic EL device according to the present embodiment. In FIG. 12, only pixel regions for RGB are shown, but, actually, as shown in FIG. 3 or 4, a plurality of pixel regions are formed on the entire surface of the actual light-emitting region 4 in the organic EL device.

The present embodiment is different from the first embodiment in that a white organic light-emitting layer 60W, which emits a white light component, is used as the organic light-emitting layer and a color filter substrate is used as the surface protecting substrate.

As shown in FIG. 12, in the organic EL device 1A of the present embodiment, the white organic light-emitting layer 60W, which emits a white light component, is provided as the light-emitting functional layer 110. Further, since light does not need to be separated for RGB, unlike the first embodiment, the white organic light-emitting layer 60W may be formed on the respective pixel electrodes 23 to cross over the organic partition layer 221.

Further, a color filter substrate 207 has a configuration in which a red colored layer 208R, a green colored layer 208G, a blue colored layer 208B, and a black matrix 209 are formed on a substrate main body 207A. Further, since the surface, on which the colored layers 208R, 208G, and 208B, and the black matrix 209 are formed, is disposed to face the substrate 20, these substrates come into contact with each other and are fixed to each other by the adhesive layer 205. Further, as the material of the substrate main body 207A, the same material as that of the surface protecting substrate 206 in the first embodiment is used.

Further, the respective colored layers 208R, 208G, and 208B are disposed to face the white organic light-emitting layer 60W on the pixel electrodes 23, and light emitted from the white organic light-emitting layer 60W transmits the colored layers 208R, 208G, and 208B. Then, respective color light components of red, green, and blue are emitted toward an observer. Therefore, in the organic EL device 1A of the present embodiment, light emitted from the white organic light-emitting layer 60W is used, and color display is preformed by the color filter substrate 207 having the colored layers 208 of a plurality of colors.

Further, the distance between each of the colored layers 208R, 208G, and 208B and the white organic light-emitting layer 60W needs be short such that light emitted from the white organic light-emitting layer 60W is emitted to only the opposite colored layer. This is because, when the distance is made long, there is a strong possibility that light emitted from the white organic light-emitting layer 60W is emitted to adjacent colored layers. Therefore, in order to suppress this possibility, the distance is preferably made short.

Then, in the present embodiment, the thin-film sealing structure is implemented by the gas barrier layer 30 or the buffering layer 210. In FIG. 12, the gap T from the surface of the insulating layer 284 to the color filter substrate 207 is about 15 μm. Therefore, the distance between the white organic light-emitting layer 60W and each of the colored layers 208R, 208G, and 208B is made short. Then, light emitted from the white organic light-emitting layer 60W is emitted to only the opposite colored layer, and leakage of light to adjacent colored layers can be suppressed. As a result, color mixture can be suppressed.

Further, in the present embodiment, since the white organic light-emitting layer 60W of a single color is used, the organic light-emitting layers need to be separately formed for RGB. Specifically, in a mask vapor deposition process for forming a low-molecular-weight white organic light-emitting layer or a liquid droplet ejection process for forming a high-molecular-weight white organic light-emitting layer, one kind of white organic light-emitting layer may be just formed by one process, and thus the manufacturing process is facilitated, as compared with the case in which the organic light-emitting layers are separately formed for RGB.

Moreover, in the present embodiment, the white organic light-emitting layer 60W irradiates light onto the respective colored layers 208R, 208G, and 208B, but, instead of the white organic light-emitting layer 60W, the organic light-emitting layers 60R, 60G, and 60B for RGB may be used, like the first embodiment. In this case, the colored layer and the organic light-emitting layer for the same color are disposed to face each other. In this configuration, with the colored layers 208r, 208G, and 208B, color correction can be performed on light components emitted from the respective organic light-emitting layers.

Third Embodiment of Organic EL device

Next, an organic EL device according to a third embodiment of the invention will be described.

In the present embodiment, the same parts as those in the first and second embodiments are represented by the same reference numerals, and the descriptions thereof will be omitted.

Figure 13:
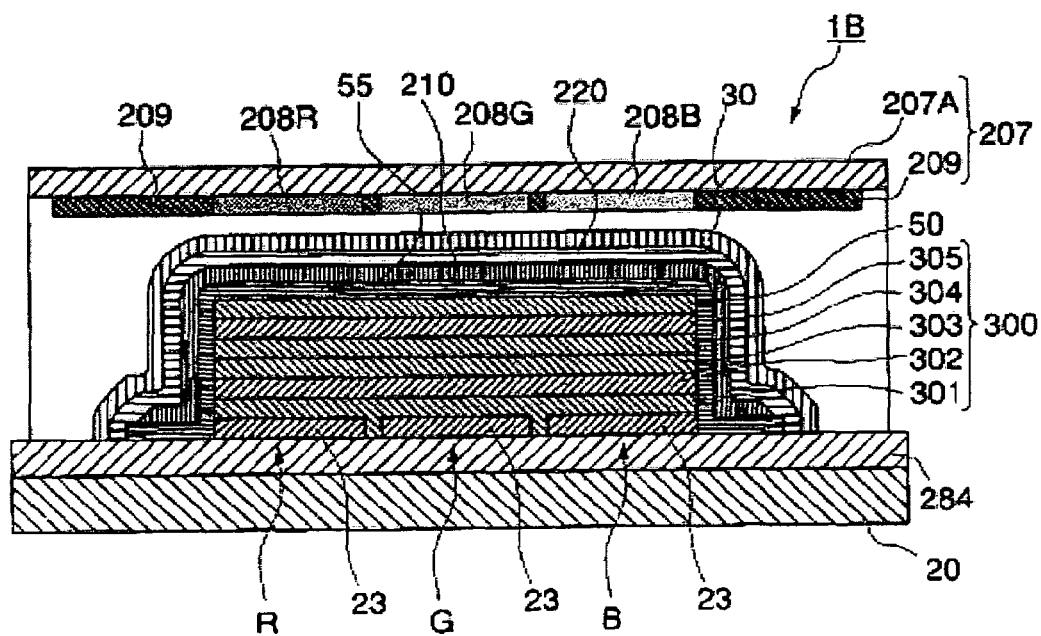
FIG. 13 is a cross-sectional view schematically showing a configuration of an organic EL device according to a third embodiment of the invention.

FIG. 13 is a cross-sectional view showing a cross-sectional structure of the organic EL device according to the present embodiment. In FIG. 13, only the pixel regions for RGB are shown, but, actually, as shown in FIG. 3 or 4, a plurality of pixel regions are formed on the entire surface of the actual light-emitting region 4 in the organic EL device.

The present embodiment is different from the first and second embodiments in that a low-molecular-weight light-emitting functional layer 300 is used. Further, the organic EL device 1B of the present embodiment irradiates a white light component from the low-molecular-weight white light-emitting element onto the color filter substrate 207. Therefore, with the colored layers 208R, 208G, and 208B, color display is performed.

Next, the configuration of the low-molecular-weight light-emitting functional layer interposed between the pixel electrode 23 and the cathode 50 will be described. Moreover, in each of the pixels RGB, the configuration of the low-molecular-weight light-emitting functional layer is the same.

As shown in FIG. 13, the low-molecular-weight light-emitting functional layer 300 has the configuration in which a polymer hole-injecting layer 301, a hole-transporting layer 302, an organic light-emitting layer 303, an electron-injecting layer 304, and an electron-injecting buffer layer 305 are sequentially laminated from the pixel electrode 23 to the cathode 50.

Here, the polymer hole-injecting layer 301 is made of triarylamine (ATP), and the hole-transporting layer 302 is made of triphenyldiamine (TPD).

Further, the organic light-emitting layer 303 is formed to have a blue organic light-emitting layer having styrylamine-based light-emitting layer (host) and an anthracene-based dopant or a yellow organic light-emitting layer having a styrylamine-based light-emitting layer (host) and a rubrene-based dopant.

Further, the electron-injecting layer 304 is an aluminum-quinolinol (Alq3) layer, and the electron-injecting buffer layer 305 is made of Lif (lithium fluoride).

Further, the cathode 50 is a laminate of an alloy, such as MgAg or the like, and ITO.

The materials of the respective organic layers 301 to 305 and LiF are sequentially formed by a vacuum vapor deposition method using a heating pot (pot). Further, as regards the formation of the cathode 50, the vacuum vapor deposition method is used for metal materials, and the high-density plasma film-deposition method, such as the ECR sputtering method, the ion plating method, an opposite target sputtering method, or the like is used for oxide materials, such as ITO or the like.

In such an organic EL device 1B, if the pixel electrodes 23 are patterned for the respective colors, it is not necessary to separately form the low-molecular-weight light-emitting functional layer 300 and the cathode. Therefore, the plasma vapor deposition, which requires high precision, does not need to be performed.

Next, a layer film, which is formed above the cathode 50, will be described.

Above the cathode 50, the cathode protecting layer 55 is formed. The cathode protecting layer 55 is formed by the high-density plasma film-deposition method, such as the ECR sputtering method or the ion plating method. As the material, a silicon compound, such as silicon oxynitride or the like, is preferably used in consideration of transparency, adherence, and water resistance. Further, if adhesion is enhanced by an oxygen plasma treatment before the formation, adherence to the electrode is enhanced and light-emission irregularity is reduced. Further, the penetration of an organic buffering layer before curing is prevented. The film thickness is preferably 100 nm or more.

Further, above the cathode protecting layer 55, an organic buffering layer 210 is formed. Since the organic buffering layer 210 is coated and formed under a low-pressure vacuum, a main component of a raw material before curing should be an organic compound material, which has excellent fluidity with no volatile component, such as a solvent, preferably, epoxy monomer/oligomer having an epoxy group and a molecular weight of 3000 or less (definition of monomer: molecular weight of 1000 or less and definition of oligomer: molecular weight of 1000 to 3000). For example, bisphenol A-type epoxy oligomer or bisphenol F-type epoxy oligomer, phenol novolac-type epoxy oligomer, 3,4-epoxy cyclohexenyl methyl-3',4'-epoxy cyclohexene carboxylate, ε-caprolactone modification 3,4-epoxy cyclohexyl methyl 3',4'-epoxy cyclohexene carboxylate, or the like is exemplified. These are used in a single or in combination.

Further, as a curing agent, which reacts with epoxy monomer/oligomer, a material, which has excellent electrical insulation or adhesion and high hardness, and forms a cured film exhibiting excellent heat resistance through toughening, can be used. In particular, an addition polymerization type having excellent transparency and small variation in hardness is used. For example, an acid anhydride-based curing agent, such as 3-methyl-1,2,3,6-tetrahydro phthalic anhydride, methyl-3,6-endomethylene-1,2,3,6-tetrahydro phthalic anhydride, 1,2,4,5-benzene tetracarboxylic dianhydride, 3,3', 4,4'-benzophenone tetracarboxylic dianhydride, or the like, is preferably used. Curing of these materials is performed with heat in a range of 60 to 100° C. The cured film is a polymer having ester binding, which has excellent adherence to the silicon oxynitride.

Further, as a curing accelerator, which accelerates decyclization of acid anhydride, aromatic amine or alcohols, or a material having a relatively high molecular weight, such as aminophenol or the like is added, and thus curing is performed at low temperature and short time.

Viscosity of each raw material is preferable in a range of 1000 to 10000 mPa·s (room temperature). This is to allow the non-light-emitting region, which is called the dark spot, not to occur due to the penetration into the organic light-emitting layer just after coating or to set the film thickness in a range of 3 to 10 μm. By suppressing the film thickness, the color filter substrate 207 can be disposed closer to the organic light-emitting layer 303. Therefore, leakage of light to adjacent colored layers does not occur, thereby increasing the light-emitting region. Further, viscosity of the material for the buffering layer in which these materials are mixed should be 1000 mPa·s (room temperature). These materials are cured by heating at a temperature of 60 to 100° C. At this time, there is a problem in that viscosity is temporarily lowered until the reaction is initiated just after heating. In this case, the material transmits the cathode protecting layer 55 or the cathode 50 and reaches Alq3, which causes the dark spots. Then, it is preferable to leave the low temperature until curing progresses up to a certain point and to perform complete curing by increasing a temperature after high viscosity is obtained to some degree. Further, in order to prevent viscosity from lowering, a cation-emission-type photo polymerization initiator may be added and partial curing may be performed at low illuminance of 10 mW/cm$^2$ or less before heating. However, there are many cases in which the photo polymerization initiator is colored, and thus the above-described configuration is limited to the bottom-emission type.

Further, since the dark spots do not occur, the main component of the material for the buffering layer (for example, 70 weight percent or more) is preferably 1000 mPa·s or more. This is because, the components having low viscosity mixed with large amount may penetrate into the organic light-emitting layer by heating before curing when curing is performed, thereby causing the dark spots.

Further, in the present embodiment, in order to enhance adherence to the cathode 50 or the gas barrier layer 30, the silane coupling agent is contained in the buffering layer 210.

In particular, in case of the low-molecular-weight organic light-emitting layer 303, the silane coupling agent is mixed into the material for the buffering layer 210 or a layer of the silane coupling agent is added, and a cathode protecting layer is added. In addition, since the layer of the silane coupling agent in single may degrade film strength, film strength may be supplemented with the buffering layer 210. Further, in order for the silane coupling agent to prevent the penetration into a pin hole of the cathode protecting layer 55, the silane coupling agent is preferably mixed into the material of the buffering layer 210.

The silane coupling agent generates covalent binding with $SiO_2$, SiON, SiN, and thus adherence to the cathode protecting layer or the gas barrier layer, the glass substrate, and the like is enhanced (which also reacts with a metal, such as aluminum or the like). As the silane coupling agent, epoxy silane is preferably used. It is preferable in that epoxy silane also reacts with a curing agent component (acid anhydride-based curing agent) of the raw material of the buffering layer.

Further, the composition of base resin/curing agent/curing accelerator is preferably 40 to 45/40 to 45/10 to 20 (common to the low-molecular-weight and high-molecular-weight light-emitting elements). If doing so, non-cured component becomes 10 to 20% (which can be compared with (a residual ratio of a non-reactive epoxy group after curing): (a difference in absorption peak intensity of the epoxy group of FTIR), when the non-reactive epoxy group in the raw material of the buffering layer is 100%), and thus deterioration due to the penetration into the light-emitting functional layer caused by the non-cured component can be prevented. (If the non-cured component is 20% or less, it is referred to as complete curing.)

Further, a curing agent group (acid anhydride and amine) remains as the material composition and the non-cured ratio is about 10% (when dicarboxylic acid anhydride in the raw material is 100%, the residual ratio of the non-reactive acid anhydride group). When the curing agent remains in the resultant film to that extent, the shrinkage is small when curing, and flexibility for relieving stress is given, such that the organic EL element can be prevented from being damaged.

In particular, since the raw material having low viscosity may dissolve the material of the low-molecular-weight light-emitting element (for example, dissolve Alq3), for the low-molecular-weight light-emitting element, the raw material having high viscosity is preferably used. On the other hand, in case of the high-molecular-weight light-emitting element, such a problem does not occur. If the molecular weight of each material is increased and viscosity is increased, improvement can be achieved. In case of the low-molecular-weight light-emitting element, preferable viscosity (or molecular weight) is in a range of 3000 mPa·s to 8000 mPa·s (at room temperature), and thus the film thickness (about 5 μm) and planarization of the coated surface at the time of screen printing can be simultaneously accomplished.

Moreover, in addition to the silane coupling agent, a moisture supply agent, such as an isocyanate compound or the like, and an additive, such as fine particles or the like, for preventing shrinkage at the time of curing may be mixed therein.

Further, above the organic buffering layer 210, the gas barrier layer 30 is formed. As the forming method of the gas barrier layer 30, the high-density plasma film-deposition method, such as the ECR sputtering method or the ion plating method, is used. As the material, a silicon compound, such as silicon oxynitride or the like, is preferably used in consideration of transparency, gas barrier property, and water resistance. Further, if adherence is enhanced through an oxygen plasma treatment before the formation, reliability is enhanced. The film thickness is preferably 300 nm or more, since, if the film thickness is 200 nm or less, the surface and the side surface of the organic buffering layer are not sufficiently covered.

As described above, according to the organic EL device 1B of the present embodiment, the cathode protecting layer 55 is made of silicon oxynitride, and the buffering layer 210 has the epoxy-based compound and the silane coupling agent, and thus the dark spots can be prevented from causing in the electron-injection layer 304.

EXAMPLE

Hereinafter, the invention will be described more specifically by way of an example.

In the present example, the results of seven experiments will be described, that is, (1) an experiment on the number of generated dark spots, (2) an experiment on the generation time of the dark spot, (3) an experiment on the time of the change in quality of the cathode, (4) an experiment for confirming the shape of the buffering layer marginal portion and presence/absence of the non-light-emitting region, (5) an experiment on viscosity of the coating material for the buffering layer and the film thickness of the buffering layer, and the number of generated dark spots at the beginning, (6) an experiment for confirming the film thickness of the gas barrier layer and presence/absence of the dark spot, (7) an experiment for confirming presence/absence of the dark spot when the silane coupling agent is used as the material of the buffering layer.

at 60° C. under the air atmosphere, without performing the defoaming treatment.

(C) 'Air coating+Low-pressure debubbling+Curing at 60° C. with nitrogen substitution'

The buffering layer was coated and formed by the screen printing method under an air atmosphere, was subjected to a debubbling treatment for three minutes under a low-pressure

TABLE 1

| BUFFERING LAYER FORMING METHOD | CONFIGURATION OF SEALING LAYER | | | | THE NUMBER OF GENERATED DARK SPOTS |
|---|---|---|---|---|---|
| THE NUMBER OF GENERATED DARK SPOTS | ELECTRODE PROTECTING LAYER | BUFFERING LAYER | THE NUMBER OF BUBBLES | GAS BARRIER LAYER | 60° C. 90% RH 600 HOURS |
| A VACUUM COATING + DEFOAMING WITH NITROGEN SUBSTITUTION + CURING AT 60° C. WITH NITROGEN SUBSTITUTION | SiON 100 nm | EPOXY 10 μm | 0 | SiON 200 nm | NONE |
| B AIR COATING + CURING AT 60° C. IN AIR | SiON 100 nm | EPOXY 10 μm | 100 OR MORE | SiON 200 nm | 100 OR MORE |
| C AIR COATING + LOW-PRESSURE DEBUBBLING + CURING AT 60° C. WITH NITROGEN SUBSTITUTION | SiON 100 nm | EPOXY 10 μm | 5 TO 20 | SiON 200 nm | 2 TO 3 |

(1) Experiment on the Number of Generated Dark Spots

Table 1 shows the experiment result on the number of generated dark spots.

As an evaluation method, for a light-emitting panel in which, on the base substrate 200, the light-emitting functional layer 110, the cathode 50, the cathode protecting layer 55, the buffering layer 210, the gas barrier layer 30, the protective layer (polyimide film with adhesive layer) 204 are sequentially laminated, the number of generated dark spots was observed after 600 hours at 60° C. and 90% RH, when the forming process of the buffering layer is formed by the following three methods.

In Table 1, (A) to (C) mean:

(A) 'Vacuum coating+Defoaming with nitrogen substitution+Curing at 60° C. with nitrogen substitution'

The buffering layer was coated and formed by the screen printing method under a vacuum atmosphere of 50 Pa, was subjected to a defoaming treatment for three minutes under an atmosphere of about 10000 Pa with nitrogen gas injection, and then was cured at 60° C. under the same pressure (which corresponds to the manufacturing method of the above-described embodiment).

(B) 'Air coating+Curing at 60° C. in air'

The buffering layer was coated and formed by the screen printing method under an air atmosphere and then was cured atmosphere of 100 Pa, and then was cured at 60° C. under a high pressure of about 100000 Pa with nitrogen gas injection.

Further, in each of (A) to (C), the cathode protecting layer made of silicon oxynitride (SiON) was formed, epoxy resin was formed to have the thickness of 10 μm as the buffering layer, and the gas barrier layer made of silicon oxynitride (SiON) was formed to have the thickness of 200 nm. Further, the number of bubbles in the buffering layer before the experiment is set to zero in (A), 100 or more in (B), and 5 to 20 in (C).

Moreover, in this experiment, in all (A) to (C), a target in which epoxy monomer was formed in a region of 40×40 mm by the screen printing method with no solvent and was heated and cured at 60° C., was used.

As shown in the experiment result of Table 1, when the buffering layer is formed by the (A) method, it was confirmed that no dark spots was generated. Further, it was confirmed that 100 or more dark spots were generated in the (B) method, and 2 to 3 dark spots was generated in the (C) method.

As apparent from Table 1, by forming the buffering layer under the low-pressure vacuum state, water absorption did not occur in the coating process. Further, the bubbles could be defoamed in the subsequent defoaming process, and thus the dark spots could be reduced.

TABLE 2

| ORGANIC EL ELEMENT | CONFIGURATION OF SEALING LAYER | | | | GENERATION TIME OF |
| --- | --- | --- | --- | --- | --- |
| GENERATION TIME OF DARK SPOT | ELECTRODE PROTECTING LAYER | BUFFERING LAYER | DRYING PROCESS | GAS BARRIER LAYER | DARK SPOT 60° C. 90% RH |
| D EPOXY/ACID ANHYDRIDE (NO SOLVENT) | SiON 100 nm | EPOXY 10 μm | NONE | SiON 200 nm | 700 HOURS OR MORE |
| E ACRYL/XD1 (SOLVENT: ETHYL ACETATE) | SiON 100 nm | EPOXY 10 μm | LOW-PRESSURE 100 Pa 30 min | SiON 200 nm | 400 TO 500 HOURS OR MORE |
| F ACRYL/XD1 (SOLVENT: BUTYL ACETATE) | SiON 100 nm | EPOXY 10 μm | LOW-PRESSURE 100 Pa 30 min | SiON 200 nm | 100 TO 200 HOURS OR MORE |
| G NO BUFFERING LAYER (ONLY GAS BARRIER LAYER) | — | — | — | SiON 200 nm | LESS THAN 10 HOURS |

(2) Experiment on Generation Time of Dark Spot

Table 2 shows the experiment result on time until the dark spot is generated.

The evaluation targets are (D) to (G), and (D) to (G) in Table 2 mean:

(D) a case in which epoxy monomer, the acid anhydride-based curing agent, and the reaction accelerator were mixed with no solvent, were coated and formed, and were cured so as to form the buffering layer (which corresponds to the manufacturing method of the above-described embodiment)

(E) a case in which the buffering layer was made of a mixture of an acryl polymer material and XDI (low-boiling solvent: ethyl acetate), (F) a case in which the buffering layer was made of a mixture of an acryl polymer material and XDI (high-boiling solvent: butyl acetate), and (G) a case in which no buffering layer was provided.

Further, in each of (D) to (G), the cathode protecting layer made of silicon oxynitride (SiON) was formed, the gas barrier layer made of silicon oxynitride (SiON) was formed to have the thickness of 200 nm, and the polyimide film with the adhesive layer was formed as the protective layer.

Further, in (D), as the buffering layer, epoxy resin was coated and formed to have the thickness of 10 μm by a vacuum screen printing method of 50 Pa. In addition, in (D), since the buffering layer was formed with no solvent, a low-pressure drying process was omitted. After the defoaming process was performed under the nitrogen atmosphere of about 1000000 Pa, curing was performed at 60° C.

Further, in (E) and (F), acryl resin was formed as the buffering layer by a slit coating method under an air pressure.

In addition, in (E) and (F), the drying process of the solvent was performed at room temperature under the low-pressure atmosphere (100 Pa for 30 minutes), and then curing was performed at 60° C. under an atmosphere of about 100000 Pa after purging nitrogen.

Further, in (G), the cathode protecting layer and the buffering layer were not formed and the drying process was not performed. Only the gas barrier layer and the protective layer (polyimide film with adhesive layer) were formed. Moreover, XDI in (E) and (F) means xylylenediisocyanate.

As shown in the experiment result of Table 2, it was confirmed that, when the buffering layer was formed by the (D) method, it was 700 hours or more until the dark spot was generated. Further, in the (E) method which used the low-boiling solvent, it was confirmed that the residual amount of the solvent is small and it was 400 to 500 hours until the dark spot was generated. In the (F) method which used the high-boiling solvent, it was confirmed that the residual amount of the solvent is large and it was 100 to 200 hours until the dark spot was generated. In (G) method, it was confirmed that it was 10 hours until the dark spot was generated.

Accordingly, the solvent components did not enter the material of the buffering layer. Then, since the residual solvent components did not exert an influence on the light-emitting element, high reliability was obtained. Further, in the (D) method, it was not necessary to remove the solvent components, and thus liquid viscosity was stable under the low-pressure vacuum state and the film thickness was stable. Further, the drying process did not need to be performed, and thus the process time could be reduced.

TABLE 3

| EXPERIMENT ON CHANGE IN QUALITY OF | CONFIGURATION OF SEALING LAYER | | | | TIME OF CHANGE IN QUALITY OF CATHODE |
| --- | --- | --- | --- | --- | --- |
| CATHODE (CALCIUM/ ALUMINUM) | ELECTRODE PROTECTING LAYER | BUFFERING LAYER | OXIDATION TREATMENT | GAS BARRIER LAYER | 110° C. 85% RH 0.12 MPa |
| H WITH ORGANIC ADHERING LAYER | SiON 100 nm | EPOXY 10 μm | YES | SiON 200 nm | 120 HOURS OR MORE |

TABLE 3-continued

| EXPERIMENT ON CHANGE IN QUALITY OF | CONFIGURATION OF SEALING LAYER | | | | TIME OF CHANGE IN QUALITY OF CATHODE |
|---|---|---|---|---|---|
| CATHODE (CALCIUM/ ALUMINUM) | ELECTRODE PROTECTING LAYER | BUFFERING LAYER | OXIDATION TREATMENT | GAS BARRIER LAYER | 110° C. 85% RH 0.12 MPa |
| I NO ORGANIC ADHERING LAYER | SiON 100 nm | EPOXY 10 μm | NO | SiON 200 nm | LESS THAN 30 HOURS (GAS BARRIER LAYER IS REMOVED) |

(3) Experiment on the Time of the Change in Quality of the Cathode

Table 3 shows the experiment result on the time until the cathode 50 made of a laminate of calcium and aluminum formed on the light-emitting functional layer 110 is changed in quality.

The evaluation targets are two:
(H) a case in which the organic adhering layer was provided, and
(I) a case in which the organic adhering layer was not provided.

Further, in each of (H) and (I), the cathode protecting layer made of silicon oxynitride (SiON) was formed to have the thickness of 100 nm. The epoxy-based buffering layer material was coated and formed to have the thickness of 10 μm as the buffering layer by the vacuum screen printing method, and was cured at 60° C. after the deforming process through nitrogen purging. The gas barrier layer made of silicon oxynitride (SiON) was formed to have the thickness of 200 nm. Further, as the protective layer, the polyimide with the adhesive layer was formed. Further, in (H), the buffering layer was subjected to a low-pressure oxygen plasma treatment. In (I), the buffering layer was not subjected to the low-pressure oxygen plasma treatment.

As shown in the experiment result of Table 3, it was confirmed that, when the organic adhering layer was formed by the (H) method, adherence to the gas barrier layer was enhanced, and thus it was 120 hours or more until the cathode was changed in quality. Further, in the (I) method, it was confirmed that, since adherence to the gas barrier layer was not obtained, it was less than 30 hours until the cathode was changed in quality.

Accordingly, by forming the organic adhering layer, adherence of the gas barrier layer and the buffering layer could be enhanced. In particular, since the gas barrier layer was not removed under a high temperature condition, high reliability could be obtained.

(4) Experiment for Confirming the Shape of the Buffering Layer Marginal Portion and Presence/absence of the Non-light-emitting Region.

Table 4 shows the experiment result on presence/absence of the non-light-emitting region when the shape of the buffering layer marginal portion (see FIG. 6) is the wavy shape (with ruffles) and the linear shape (no ruffle).

As an evaluation method, aging was performed for 100 hours at 110° C. and 85% RH (consecutive operation of organic EL device).

In Table 4, (J) and (K) mean:
(J) a case in which the buffering layer marginal portion was 'with ruffle (wavy shape)', and
(K) a case in which the buffering layer marginal portion was 'no ruffle (linear shape)'.

Moreover, as the same condition, the electrode protecting layer made of SiON was formed to have the thickness of 100 nm, the buffering layer made of epoxy was formed to have the thickness of 5 μm, and the gas barrier layer 30 made of SiON was formed to have the thickness of 400 nm.

As shown in the experiment result of Table 4, the buffering layer marginal portion was the linear shape, the non-light-emitting region occurred in the peripheral portion. In contrast, when the buffering layer marginal portion was the wavy shape, the entire surface was turned on. From this, by making the buffering layer marginal portion in the wavy shape, adherence of the side portion of the overlying gas barrier layer was enhanced and moisture resistance was enhanced. This was because, by increasing a mixing region where the gas barrier layer, the buffering layer, and the substrate come into contact with one another, when the buffering layer expanded in a horizontal direction by heat or the like, the removal of the gas barrier layer or cracks did not occur.

TABLE 4

| | CONFIGURATION OF SEALING LAYER | | | |
|---|---|---|---|---|
| SHAPE OF BUFFERING LAYER | ELECTRODE PROTECTING LAYER | BUFFERING LAYER * | GAS BARRIER LAYER | 110° C. 85% RH 100 HOURS |
| J WITH RUFFLE | SiON 100 nm | EPOXY 5 μm | SiON 400 nm | ENTIRE SURFACE IS TURNED ON |
| K NO RUFFLE | SiON 100 nm | EPOXY 5 μm | SiON 400 nm | NON-LIGHT-EMITTING REGION OCCURS IN PERIPHERAL REGION |

TABLE 5

| | COATING MATERIAL OF BUFFERING LAYER (VISCOSITY) | CONFIGURATION OF SEALING LAYER | | | THE NUMBER OF DARK SPOTS AT THE BEGINNING |
|---|---|---|---|---|---|
| | | ELECTRODE PROTECTING LAYER | BUFFERING LAYER * | GAS BARRIER LAYER | (LIGHT-EMITTING REGION HAS ANGLE OF 20 mm) |
| L | EPOXY WITH NO SOLVENT (VISCOSITY: 10000 mPa·s) | SiON 100 nm | EPOXY 9 μm | SiON 400 nm | TWO OR LESS |
| M | EPOXY WITH NO SOLVENT (VISCOSITY: 5000 mPa·s) | SiON 100 nm | EPOXY 5 μm | SiON 400 nm | TWO OR LESS |
| N | EPOXY WITH NO SOLVENT (VISCOSITY: 1000 mPa·s) | SiON 100 nm | EPOXY 3 μm | SiON 400 nm | TWO OR LESS |
| O | EPOXY WITH NO SOLVENT (VISCOSITY: 500 mPa·s) | SiON 100 nm | EPOXY 3 μm | SiON 400 nm | 10 TO 20 |
| P | EPOXY WITH NO SOLVENT (VISCOSITY: 500 mPa·s) | SiON 100 nm | EPOXY 2 μm | SiON 400 nm | 20 TO 40 |
| Q | NO ELECTRODE PROTECTING LAYER | — | EPOXY 5 μm | SiON 400 nm | 50 OR MORE |
| R | NO ORGANIC BUFFERING LAYER | SiON 2000 nm | — | — | NON-EMITTING (ELECTRODE IS REMOVED) |

(5) Experiment on Viscosity of the Coating Material of the Buffering Layer, the Film Thickness of the Buffering Layer, and the Number of Generated Dark Spots at the Beginning Table 5 shows the experiment result on viscosity of the coating material of the buffering layer, the film thickness of the buffering layer, and the number of generated dark spots at the beginning.

As an evaluation method, at the beginning when the organic EL device starts to operate, the number of generated dark spots was examined.

In Table 5, (L) to (R) mean:
(L) a case in viscosity of the coating material of the buffering layer was 10000 mPa·s and the film thickness thereof was 9 μm,
(M) a case in viscosity of the coating material of the buffering layer was 5000 mPa·s and the film thickness thereof was 5 μm,
(N) a case in viscosity of the coating material of the buffering layer was 1000 mPa·s and the film thickness thereof was 3 μm,
(O) a case in viscosity of the coating material of the buffering layer was 500 mPa·s and the film thickness thereof was 3 μm,
(P) a case in viscosity of the coating material of the buffering layer was 500 mPa·s and the film thickness thereof was 2 μm, and
(Q) a case in viscosity of the coating material of the buffering layer was 5000 mPa·s, the film thickness thereof was 5 μm, and the electrode protecting layer was not provided.

Moreover, as the same condition, the electrode protecting layer was formed to have the thickness of 100 nm, excluding (Q) and (R). Further, the film thickness of the gas barrier layer 30 was 400 nm, excluding (R).

As shown in the experiment result of Table 5, in (R), the electrode was removed and light-emission was not performed. In (R), it was confirmed that the dark spots of 50 or more occurred at the beginning. In (P), it was confirmed that the dark spots of 20 to 40 occurred at the beginning. In (O), it was confirmed that dark spots of 10 to 20 occurred at the beginning. In (L) to (N), it was confirmed that the dark spots of two or less occurred.

As such, it was confirmed that, when viscosity of the buffering layer was in the range of 1000 to 10000 mPa·s, the film thickness of the buffering layer was suppressed to 10 μm or less and the initial dark spots were suppressed. Further, by suppressing the film thickness of the buffering layer, the color filter substrate 207 could be disposed close to the organic light-emitting layer at a gap of 15 μm or less, and thus the aperture ratio of the pixel could be further increased.

TABLE 6

| | CONFIGURATION OF SEALING LAYER | | | | 60° C. 90% RH 600 HOURS |
|---|---|---|---|---|---|
| | GAS BARRIER LAYER | ELECTRODE PROTECTING LAYER | BUFFERING LAYER * | GAS BARRIER LAYER | |
| S | 200 nm | SiON 100 nm | EPOXY 5 μm | SiON 200 nm | PERIPHERAL PORTION DOES NOT EMIT LIGHT (DARK SPOT OCCURS) |

TABLE 6-continued

| | CONFIGURATION OF SEALING LAYER | | | | 60° C. 90% RH 600 HOURS |
|---|---|---|---|---|---|
| | GAS BARRIER LAYER | ELECTRODE PROTECTING LAYER | BUFFERING LAYER * | GAS BARRIER LAYER | |
| T | 400 nm | SiON 100 nm | EPOXY 5 μm | SiON 400 nm | ENTIRE SURFACE LIGHT EMISSION (NO DARK SPOT) |
| U | 600 nm | SiON 100 nm | EPOXY 5 μm | SiON 600 nm | ENTIRE SURFACE (NO DARK SPOT) |
| V | 800 nm | SiON 100 nm | EPOXY 5 μm | SiON 800 nm | CRACK OCCURS IN SEALING LAYER |

(6) Experiment on the Film Thickness of the Gas Barrier Layer and Presence/absence of the Dark Spot Table 6 shows the experiment result on the film thickness of the gas barrier layer and presence/absence of the dark spot.

As an evaluation method, aging was performed for 600 hours at 60° C. and 90% RH (consecutive operation of organic EL device).

In Table 6, (S) to (V) mean:

(S) a case in which the gas barrier layer had the thickness of 200 nm, (T) a case in which the gas barrier layer had the thickness of 400 nm, (U) a case in which the gas barrier layer had the thickness of 600 nm, and (V) a case in which the gas barrier layer had the thickness of 800 nm.

Moreover, as the same condition, the electrode protecting layer made of SiON was formed to have the thickness of 100 nm, and the buffering layer made of epoxy was formed to have the thickness of 5 μm.

As shown in the experiment result of Table 6, when the film thickness of the gas barrier layer was 200 nm, the peripheral region did not emit light (dark spot occurs). In contrast, when the film thickness of the gas barrier layer was 400 nm and 600 nm, the entire surface was turned on. The film thickness of the gas barrier layer is effective for reliability evaluation. When the gas barrier layer had the film thickness of 200 nm or less, the surface to be left was uneven or coatability of the side surface was lowered at the time of screen printing. Further, moisture penetrated, which causes the dark spot. Further, the film thickness of the gas barrier layer should have 700 nm or more, but, if the film thickness exceeds 1 μm, stress of the gas barrier layer is increased, which causes cracks or the like. Therefore, when the film thickness of the gas barrier layer was in a range of 400 to 600 nm, the gas barrier layer having gas barrier property and crack resistance could be implemented.

TABLE 7

| | CATHODE PROTECTING LAYER | BUFFERING LAYER | OCCURRENCE OF DARK SPOT | |
|---|---|---|---|---|
| | | | HIGH-MOLECULAR-WEIGHT EL | LOW-MOLECULAR-WEIGHT EL |
| W | NONE | EPOXY + SILANE COUPLING AGENT | NOT CONFIRMED | CONFIRMED |
| X | SiON 100 nm | EPOXY + SILANE COUPLING AGENT | NOT CONFIRMED | NOT CONFIRMED |
| Y | SiON 100 nm | EPOXY | NOT CONFIRMED | CONFIRMED |

(7) Experiment on Presence/absence of the Dark Spot when the Silane Coupling Agent was Used as the Material of the Buffering Layer Table 7 shows the experiment result on presence/absence of the dark spot when the silane coupling agent was used as the material of the buffering layer.

In Table 7, (W) to (Y) mean:

(W) a case in which the cathode protecting layer was not formed, and the buffering layer contains epoxy and the silane coupling agent, (X) a case in which the cathode protecting layer made of SiON was formed to have the thickness of 100 nm, and the buffering layer contained epoxy and the silane coupling agent, and (Y) a case in which the cathode protecting layer made of SiON was formed to have the thickness of 100 nm, and the buffering layer contained epoxy.

TABLE 8

| RAW MATERIAL COMPONENT OF BUFFERING LAYER | NAME OF MATERIAL | COMPOSITION RATIO (wt %) | ROOM TEMPERATURE VISCOSITY mPa · s |
|---|---|---|---|
| EPOXY COMPOUND | BISPHENOL F-TYPE EPOXY COMPOUND | ABOUT 20% | 5200 |
| | HIGH-MOLECULAR-WEIGHT EPOXY COMPOUND | ABOUT 20% | SOLID |
| ACID ANHYDRIDE-BASED CURING AGENT | 3-METHYL-1,2,3,6-TETRAHYDROPHTHALIC ANHYDRIDE | ABOUT 40% | 1800 |
| CURING ACCELERATOR | PHENOLAMINE COMPOUND | ABOUT 20% | SOLID |
| SILANE COUPLING AGENT | 2-(3,4 EPOXYCYCLOHEXYL) ETHYLTRIMETHOXYSILANE | ABOUT 1% | 2000 |
| TOTAL | | 100% | 4600 |

Table 8 shows the materials constituting the buffering layer used in (W) to (Y) in Table 7, the composition ratio, and viscosity at room temperature.

Moreover, this experiment is performed in the high-molecular-weight organic EL device (the first and second embodiments) and the low-molecular-weight organic EL device (the third embodiment).

As shown in the experiment result of Table 7, in case of the high-molecular-weight organic EL device, in all (W), (X), and (Y), it was not confirmed that the dark spot occurred. Further, in case of the low-molecular-weight organic EL device, in (W) and (Y), it was confirmed that the dark spot occurred. In (X), it was not confirmed that the dark spot occurred.

As such, in the low-molecular-weight organic EL device, the cathode protecting layer of SiON and the buffering layer made of epoxy and silane coupling agent are combined, and then the silane coupling agent is coupled with the cathode protecting layer, thereby filling in the cathode protecting layer. Accordingly, the dark spot is suppressed from causing.

Electronic Apparatus

Next, an electronic apparatus of the invention will be described.

The electronic apparatus has the above-described organic EL device 1 as a display unit. Specifically, the electronic apparatuses shown FIGS. 14A to 14C can be exemplified.

Figure 14A:
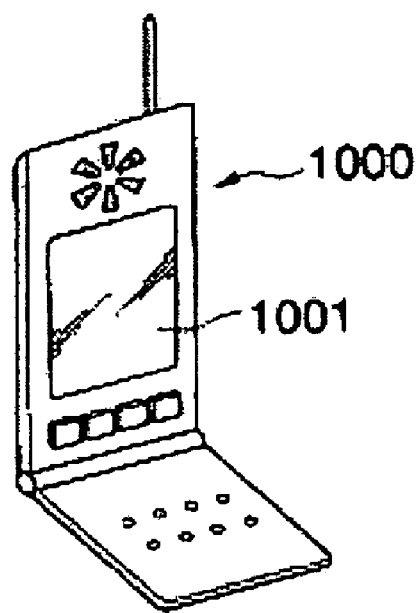
FIG. 14A is a diagram showing an electronic apparatus.

FIG. 14A is a perspective view showing an example of a cellular phone. In FIG. 14A, a cellular phone 1000 has a display unit 1001 using the above-described organic EL device 1.

Figure 14B:
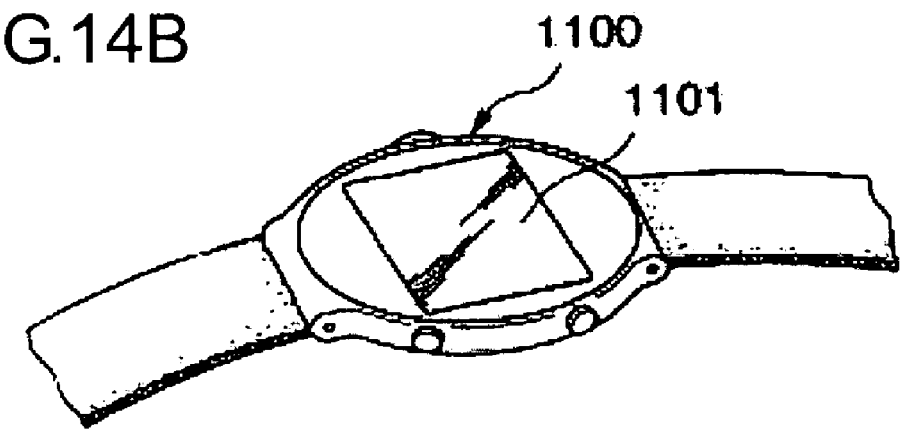
FIG. 14B is a diagram showing an electronic apparatus.

FIG. 14B is a perspective view of an example of a wrist watch-type electronic apparatus. In FIG. 14B, a watch 1100 has a display unit 1101 using the above-described organic EL device 1.

Figure 14C:
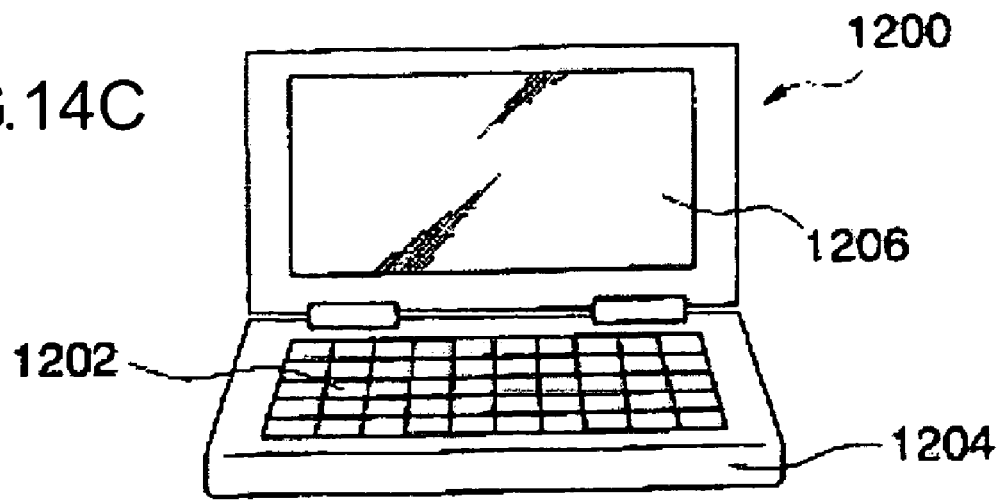
FIG. 14C is a diagram showing an electronic apparatus.

FIG. 14C is a perspective view showing an example of a portable information processing device, such as a word processor, a personal computer, or the like. In FIG. 14C, an information processing device 1200 has an input unit 1202, such as a keyboard or the like, a display unit 1206 using the above-described organic EL device 1, and an information processing device main body (case) 1204.

The electronic apparatuses shown in FIGS. 14A to 14C includes the display units 1001, 1101, and 1206 having the above-described organic EL device 1, respectively, and thus lifetime of the light-emitting element of the organic EL device constituting the display unit is enhanced.

What is claimed is:

1. An organic electroluminescent device comprising: a substrate having a planar surface
   first electrodes;
   a second electrode opposing the first electrodes;
   a light-emitting functional layer between the second electrode and one of the first electrodes;
   a buffering layer that covers the second electrode, the buffering layer having a side end portion with an angle equal to or less than 30° with respect to the planar surface; and
   a gas barrier layer covering the buffering layer, extending beyond an outer side of the buffering layer and covering a marginal portion of the buffering layer, wherein an organic adhering layer is disposed between the buffering layer and the gas barrier layer, the organic adhering layer having an oxygen atomic weight % more than that of the buffering layer.

2. The organic electroluminescent device according to claim 1, wherein a marginal portion of a planar pattern of the buffering layer is formed in a wavy shape.

3. An electronic apparatus having the organic electroluminescent device according to claim 1.

4. An organic electroluminescent device comprising,
   on a substrate having a planar surface
   first electrodes;
   a second electrode opposing the first electrodes;
   a light-emitting functional layer between the second electrode and one of the first electrodes;
   a buffering layer that covers the second electrode;
   a gas barrier layer covering the buffering layer, extending beyond an outer side of the buffering layer and covering a marginal portion of the buffering layer; and
   a marginal side portion of a planar pattern of the buffering layer being formed in a wavy shape in a plane parallel to the planar surface of the substrate, wherein an organic adhering layer is disposed between the buffering layer and the gas barrier layer, the organic adhering layer having an oxygen atomic weight % more than that of the buffering layer.

* * * * *